(12) United States Patent
Kastner et al.

(10) Patent No.: US 10,990,723 B2
(45) Date of Patent: Apr. 27, 2021

(54) TECHNIQUES FOR IMPROVING SECURITY OF CIRCUITRY DESIGNS BASED ON A HARDWARE DESCRIPTION LANGUAGE

(71) Applicant: The Regents of the University of California, Oakland, CA (US)

(72) Inventors: Ryan Kastner, La Jolla, CA (US); Armaiti Ardeshiricham, La Jolla, CA (US); Wei Hu, La Jolla, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/354,002

(22) Filed: Mar. 14, 2019

(65) Prior Publication Data

US 2019/0286763 A1    Sep. 19, 2019

Related U.S. Application Data

(60) Provisional application No. 62/642,966, filed on Mar. 14, 2018.

(51) Int. Cl.
*G06F 30/33* (2020.01)
*G06F 30/327* (2020.01)

(52) U.S. Cl.
CPC ........... *G06F 30/327* (2020.01); *G06F 30/33* (2020.01)

(58) Field of Classification Search
CPC .. G01N 35/1065; G01N 15/1475; B01L 9/06; G06F 11/3438; G06F 11/3476;
(Continued)

(56) References Cited

U.S. PATENT DOCUMENTS 8,464,204 B1 *  6/2013  Thornton ............ G06F 11/3608
                                                          717/100
8,972,931 B1 *  3/2015  Pillarisetti ................ G06F 8/10
                                                          717/107
(Continued)

OTHER PUBLICATIONS

Aciicmez, O. et al., "Cheap Hardware Parallelism Implies Cheap Security," Workshop on Fault Diagnosis and Tolerance in Cryptography (FDTC 2007), Vienna, 2007, pp. 80-91.
(Continued)

*Primary Examiner* — Binh C Tat
(74) *Attorney, Agent, or Firm* — Perkins Coie LLP

(57) ABSTRACT

Disclosed are devices, apparatuses, systems, computer readable media, and methods for improving the security of circuitry designs using HDL code. In one aspect a method is disclosed. the method includes receiving a hardware design language (HDL) representation of a circuit; inserting flow tracking into the HDL representation, wherein the flow tracking adds one or more security labels that are tracked throughout the circuit; and generating an enhanced HDL representation of the circuit, wherein the enhanced HDL representation comprises the HDL representation and the flow tracking, wherein the enhanced representation including the one or more security labels that are tracked throughout the circuit enables a security determination a model for tracking timing-based information flows through HDL code is disclosed. The disclosed technology is used to verify security properties on a variety of equipment including crypto cores, bus architectures, caches and arithmetic modules.

19 Claims, 29 Drawing Sheets

(58) Field of Classification Search
CPC .. G06F 16/2228; G06F 16/2282; G06F 16/93; G06F 3/0482; G06F 3/04842; G06F 3/04847; G06F 3/0486; G06F 40/10; G06F 40/106; G06F 40/14; G06F 40/177; G06F 40/18; G06F 40/205; G06F 7/544; G06F 9/3897; G06F 15/7867; G06F 9/3455; G06F 12/0862; G06F 15/7814; G06F 9/30047; G06F 9/30076; G06F 9/3877; G06F 12/084; G06F 12/0875; G06F 15/80; G06F 2212/452; G06F 9/3001; G06F 9/30145; G06F 30/34; G06F 30/327; G06F 30/33; G06F 30/3312; G06F 8/30; G06F 9/30181; G06F 9/3802; G06F 9/383; G06F 9/3851; G06F 9/3885; G06F 9/4494; G06T 11/206; G06T 2200/24; H03K 19/17704; H03K 19/17736
USPC .................................................. 716/100–109
See application file for complete search history.

(56) References Cited

U.S. PATENT DOCUMENTS

| | | | | |
|---|---|---|---|---|
| 2006/0095872 | A1* | 5/2006 | McElvain | G06F 30/394 716/113 |
| 2012/0254830 | A1* | 10/2012 | Conrad | G06F 8/35 717/106 |
| 2016/0026467 | A1* | 1/2016 | Sperber | G06F 9/30036 712/210 |
| 2017/0315979 | A1* | 11/2017 | Boucher | G06F 40/106 |

OTHER PUBLICATIONS

Allen, M. "Kolmogorov-Smirnov Test for Discrete Distributions" Monterey, California: Defense Technical Information Center, Mar. 1976. 46 pages.
Andrysco, M. et al., "On Subnormal Floating Point and Abnormal Timing," 2015 IEEE Symposium on Security and Privacy, San Jose, CA, 2015, pp. 623-639.
Ardeshiricham et al., "Register transfer level information flow tracking for provably secure hardware design," Design, Automation & Test in Europe Conference & Exhibition, 2017, pp. 1691-1696.
Bernstein, D. "Cache-timing attacks on AES," 2005. 37 pages.
Bidmeshki, M. et al. "Toward automatic proof generation for information flow policies in third-party hardware IP," 2015 IEEE International Symposium on Hardware Oriented Security and Trust, Washington, DC, 2015, pp. 163-168.
Brandli et al. "A 240 x 180 130 dB µs Latency Global Shutter Spatiotemporal Vision Sensor" Oct., 2014, IEEE Journal of Solid-State Circuits 49(10):2333-2341.
Crandall, J.R., et al. "Minos: Control data attack prevention orthogonal to memory model." 2004, Proc. of the 37th Int'l Symp. on Microarchitecture, pp. 221-232.
Dalton, M., et al. "Raksha: a flexible information flow architecture for software security." ISCA '07: Proceedings of the 34th annual international symposium on Computer architecture. Jun. 2007, pp. 482-493.
Decker et al. "A 256x256 CMOS imaging array with wide dynamic range pixels and column-parallel digital output," IEEE Journal of Solid-State Circuits, 2008, vol. 33, No. 12, pp. 2081-2091.
Denning, D. et al., "Certification of programs for secure information flow" Communications of the ACM, 1997, vol. 20, No. 7, pp. 504-513.
Hu et al., "Imprecise security: Quality and complexity tradeoffs for hardware information flow tracking," 2016 IEEE/ACM International Conference on Computer-Aided Design (ICCAD), Austin, TX, 2016, pp. 1-8.
Hu, "Reducing timing channels with fuzzy time," Journal of computer security, 1992. pp. 8-20.
Hu, W., et al. "Detecting Hardware Trojans with Gate-Level Information-Flow Tracking." Computer 49.8 (2016): 44-52.
IniLabs, "Welcome to iniLabs" 2018, retrieved from: https://inilabs.com. 3 pages.
Jin, Y. et al. "Proof carrying-based information flow tracking for data secrecy protection and hardware trust," 2012 IEEE 30th VLSI Test Symposium (VTS), Hyatt Maui, HI, 2012, pp. 252-257.
Kannan H., et al., "Decoupling Dynamic Information Flow Tracking with a dedicated coprocessor," 2009 IEEE/IFIP International Conference on Dependable Systems & Networks, Lisbon, 2009, pp. 105-114.
Kocher, P. "Timing attacks on implementations of diffie-hellman, rsa, dss, and other systems," Advances in Cryptology—CRYPTO'96, LNCS 1109, pp. 104-113.
Li, X., et al. "Caisson: a hardware description language for secure information flow." Proceedings of the 32nd ACM SIGPLAN Conference on Programming Language Design and Implementation, Jun. 2011, pp. 109-120.
Li, X., et al. "Sapper: A language for hardware-level security policy enforcement." Proceedings of the 19th international conference on Architectural support for programming languages and operating systems, Feb. 2014, pp. 97-112.
Lichsteiner, C., et al. "A 128x 128 120 dB 15 µ sec Latency Asynchronous Temporal Contrast Vision Sensor". In: IEEE Jornal of Solid-State Circuits 43.2 (2008), pp. 566-576.
Linares-Barranco, A., et al. "A USB3.0 FPGA Eventbased Filtering and Tracking Framework for Dynamic Vision Sensors". In: IEEE International Symposium on Circuits and Systems (2015), pp. 2417-2420.
Liu, H., et al. "Design of a Spatiotemporal Correlation Filter for Event-based Sensor". In: IEEE International Symposium on Circuits and Systems (2015), pp. 722-725.
Mendis, S., et al. "CMOS Active Pixel Image Sensors for Highly Integrated Imaging Systems". In: IEEE J. Solid State Circuits 32 (1997), pp. 187-197.
Oberg, J. "Testing Hardware Security Properties and Identifying Timing Channels." Dissertation, 2014, UCSD, 128 pages.
Oberg, J., et al., "Leveraging Gate-Level Properties to Identify Hardware Timing Channels," in IEEE Transactions on Computer-Aided Design of Integrated Circuits and Systems, 2014, vol. 33, No. 9, pp. 1288-1301.
Oberg, J., et al., "Information flow isolation in I2C and USB," DAC '11: Proceedings of the 48th Design Automation Conference, Jun. 2011, pp. 254-259.
OpenCores, "Projects" retrieved from http://opencores.org/projects. 1 page.
OpenCores, "WISHBONE" retrieved from https://opencores.org/opencores,wishbone. 1 page.
Percival, C. "Cache missing for fun and profit" 2005, 13 pages.
Pooresmaelli, A., et al. "Spatiotemporal Filtering and Motion Illusion". In: Journal of Vision, 2013, 13(10):21, 4 pages.
Pratt, J.W., et al. "Chapter 7: Kolmogorov—Smirnov Two-Sample Tests" Concepts of Nonparametric Theory, 1981, pp. 318-344.
Qin, F., et al. "Lift: A low-overhead practical information flow tracking system for detecting security attacks" 2006 39th Annual IEEE/ACM International Symposium on Microarchitecture (MICRO'06), Orlando, FL, 2006, pp. 135-148.
Rios-Navarro, A., et al. "Live demonstration: Real-time motor rotation frequency detection by spike-based visual and auditory AER sensory integration for FPGA," 2015 IEEE International Symposium on Circuits and Systems (ISCAS), Lisbon, 2015, pp. 1907-1907.
Sawada, J., et al. "TrueNorth Ecosystem for Brain-Inspired Computing: Scalable Systems, Software, and Applications" SC '16: Proceedings of the International Conference for High Performance Computing, Networking, Storage and Analysis, Salt Lake City, UT, 2016, pp. 130-141.
Schindler, W. "A timing attack against rsa with the chinese remainder theorem" CHES '00: Proceedings of the Second International Workshop on Cryptographic Hardware and Embedded Systems, Aug. 2000, pp. 109-124.

(56) References Cited

OTHER PUBLICATIONS

SecVerilog, "SecVerilog: Verilog + Information Flow" 2015, Retrieved from: http://www.cs.cornell.edu/projects/secverilog/. 2 pages.
Shankland, S. "Samsung turns IBM's brain-like chip into a digital eye" Aug. 12, 2016; CNET; retrieved from: https://www.cnet.com/news/samsungturns-ibms-brain-like-chip-into-a-digital-eye/. 4 pages.
Tian, H. "Noise Analysis in CMOS Image Sensors". PhD thesis, Aug. 2000, Stanford University. 114 pages.
Tian, H., et al. "Analysis of Temporal Noise in CMOS Photodiode Active Pixel Sensor" IEEE Journal of Solid-State Circuits, 2001, vol. 36, No. 1, pp. 92-101.
Tiwari, M., et al., "Complete information flow tracking from the gates up" ACM SIGARCH Computer Architecture News, 2009, 44(3):109-120.
Tiwari, M., et al., "Crafting a usable microkernel, processor, and i/o system with strict and provable information flow security" 2011 38th Annual International Symposium on Computer Architecture (ISCA), San Jose, CA, 2011, pp. 189-199.
Trust-Hub, "Trust-Hub" 2017, Retrieved from https://web.archive.org/web/20171109013127/https://www.trust-hub.org/. 1 page.
Vachharajani, N., et al. "RIFLE: An architectural framework for user-centric information-flow security" 37th International Symposium on Microarchitecture (Micro-37'04), Portland, OR, USA, 2004, pp. 243-254.
Venkataramani, G., et al. "Flexitaint: A programmable accelerator for dynamic taint propagation" 2008 IEEE 14th International Symposium on High Performance Computer Architecture, Salt Lake City, UT, 2008, pp. 173-184.
Wang, Z., et al. "New cache designs for thwarting software cache-based side channel attacks" ACM SIGARCH Computer Architecture News, 2007, 35(2):494-505.
Wolf, C. "Yosys Open SYnthesis Suite," 2015, retrieved from https://web.archive.org/web/20150219161942/http://github.com/cliffordwolf/yosys. 7 pages.
Yadid-Pecht, O., et al. "Optimization of Noise and Responsivity in CMOS active Pixel Sensors for Detection of Ultra Low Light Levels" SPIE, 1997, vol. 3019, pp. 125-136.
Yang, F., et al. "Bits from Photons: Oversampled Image Acquisition Using Binary Poisson Statistics". In: arXive1106.0954 (2011). 34 pages.
Yoysys, "Yosys Open Synthesis Suite" 2018, retrieved from: http://www.clifford.at/yosys/. 2 pages.
Zhang, D., et al. "A hardware design language for timing-sensitive information-flow security," ASPLOS '15: Proceedings of the Twentieth International Conference on Architectural Support for Programming Languages and Operating Systems, Mar. 2015, pp. 503-516.

\* cited by examiner

```
Module div (a, b, clk, go, q);
input [31:0] a, b;
input clk, go;
output [31:0] q;
reg [9:0] counter;
always @(posedge clk)
  if (done & go)   // reset...
  else if( !done)
    Decrease counter
    Shift the divisor
    if (dividend >= divisor)       ── 120
      Update temp_quotient
      Subtract divisor from dividend
    if(counter==0)                 ── 110
      Write temp_quotient to out
      set done
// counter implementation
```

FIG. 1

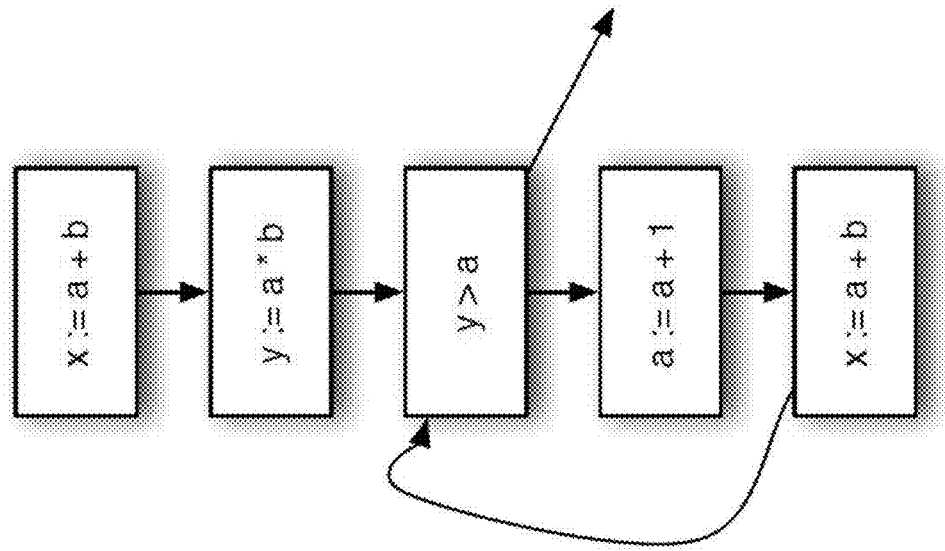
FIG. 3C
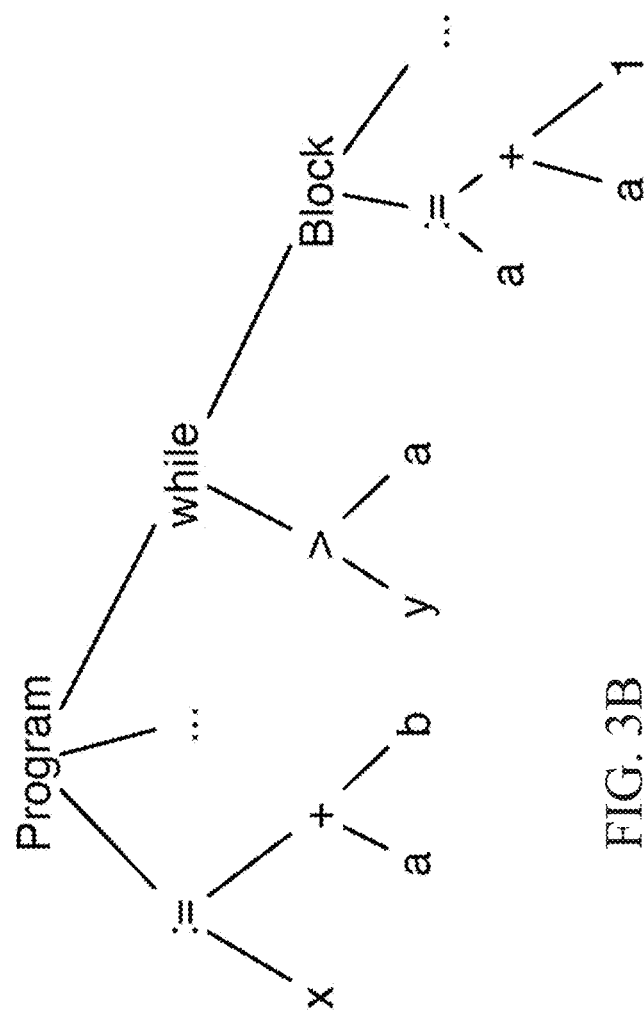
FIG. 3A
FIG. 3B

Input : Verilog code AST file
Output: IFT-enhanced Verilog code

*Preprocessing:*
1 for *each register r* do
2 | n: number of the paths to r;
3 | m: number of the controllers of r;
4 | if $n \neq 2^m$ then r_bal=0;
5 | else r_bal=1;
  end
6 for *each conditional assignment a* do
7 | traverse CFG;
8 | a_con = list of controllers;
  end

*Logic insertion:*
9 for *each variable x[n : 0]* do
10 | define x_s[n : 0], x_t[n : 0];
   end
11 for *each DFG operation a = b op c* do
12 | instantiate IFT-enhanced operation:
13 | op_IFT (a, a_s, b, b_s, c, c_s);
14 | insert time tracking logic:
15 | a_t = b_t | c_t;
   end
16 for *each controller c* do
17 | insert buffer c_buf <= c;
   end
18 for *each conditional assignment A <= B* do
19 | insert implicit IFT logic:
20 | A_s <= B_s | c_s, ∀c ∈ A_con.
21 | A_t <= (B_s & !A_buf);
22 | | (B_t & !(c is non-sensitive and fully controlling);
   end

FIG. 5

```
1.  assign M = N + P;
2.  always @(posedge clk)
3.  begin
4.     //update of "A" is
        conditional
5.     if (cond)
6.        A <= B
7.     //"X" is directly
        resulted from "A"
8.     X <= A;
9.     //"done" enforces
        constant time updates to
        "Y"
10.    if (done)
11.       Y <= X;
12.    else
13.       Y <= 0;
14.    end
15. end
```

FIG. 6A

```
1.   add_IFT a1 (.in1(N), .in1_s(N_s), .in2(P), .in2_s(P_s), .out(M), .out_s(M_s));
2.   assign M_t = N_t | P_t;
3.   always @ (posedge clk)
4.   begin
5.     if (cond)
6.       begin
7.         A   <= B;
8.         A_s <= B_s | cond_s;
9.         A_t <= (cond_s & (A_bal | (A ~^ B))
                  | (B_t & ~(cond_s & ~(A_up ^ cond_up)));
10.        cond_t
11.        | (B_t & ~(cond_s & ~(A_up ^ cond_up)));
12.      end
13.      X   <= A;
14.      X_s <= A_s;
15.      X_t <= A_t;
16.      if (done)
17.        begin
18.          Y   <= X;
19.          Y_s <= X_s | done_s;
20.          Y_t <= (done_s & (Y_bal | (Y ~^ X))
21.                  | done_t
22.                  | (X_t & ~(~done_t & ~(Y_up ^ done_up)));
23.        end
24.      else
25.        Y <= 0; Y_s <= ...; Y_t <= ...;
26.  end
```

FIG. 6B

| Design | Security Property | Security Specification | Result |
|---|---|---|---|
| Division unit | Result is ready in constant time | set dividend_s, divisor_s=H, assert(quotient_t==L) | Proved |
| multiplication unit | Result is ready in constant time | set multiplier_s, multiplicand_s=H, assert(product_t==L) | Provable after debugging |
| cache | Isolation bw accesses to the same line | set index_s=H, assert(data_t==L) | violated |
| PLcache | Isolation bw accesses to the same line | set index_s=H, assert(data_t==L) | Provable if sensitive data is preloaded |
| RPcache | Isolation bw accesses to the same line | set index_s=H, assert(data_t==L) | Provable if RNG is secure |
| WISHBONE, round robin | Timing isolation bw cores | set request1_s=H, assert(ack2_t==L) | Violated |
| WISHBONE, TDMA | Timing isolation bw cores | set request1_s=H, assert(ack2_t==L) | Proved |
| WISHBONE, TDMA+group | Timing isolation bw cores | set request1_s=H, assert(ack2_t==L) | Provable bw different groups |
| AES | Cipher is ready in constant time | set key_s, plaintext_s=H, assert(cipher_t==L) | Proved |
| RSA | Cipher is ready in constant time | set key_s, plaintext_s=H, assert(cipher_t==L) | Violated |

FIG. 7

```
module and_IFT //conservative
(Z, Z_t, X, X_t, Y, Y_t);
parameter w1,w2,w3;
output [w1-1:0] Z, Z_t;
input [w2-1] X, X_t;
input [w3-1] Y, Y_t;
assign out = X & Y;
assign out_t = X_t | Y_t;
endmodule
```

FIG. 11A

```
module and_IFT //precise
(Z, Z_t, X, X_t, Y, Y_t);
parameter w1,w2,w3;
output [w1-1:0] Z, Z_t;
input [w2-1] X, X_t;
input [w3-1] Y, Y_t;
assign out = X & Y;
assign out_t = (X_t & Y_t) |
               (X_t & Y) | (Y_t & X);
endmodule
```

FIG. 11B

```
input [7:0] a,b,c;
output [8:0] o;
assign o = a + b&c;
```

```
input [7:0] a,b,c;
input [7:0] a_t,b_t,c_t;
output [8:0] o;
output [8:0] o_t;
wire [7:0] temp, temp_t;
and_IFT #(8,8,8) and1
              (temp, temp_t, b, b_t, c, c_t);
add_IFT #(9,8,8) add1
              (o, o_t, temp, temp_t, a, a_t);
```

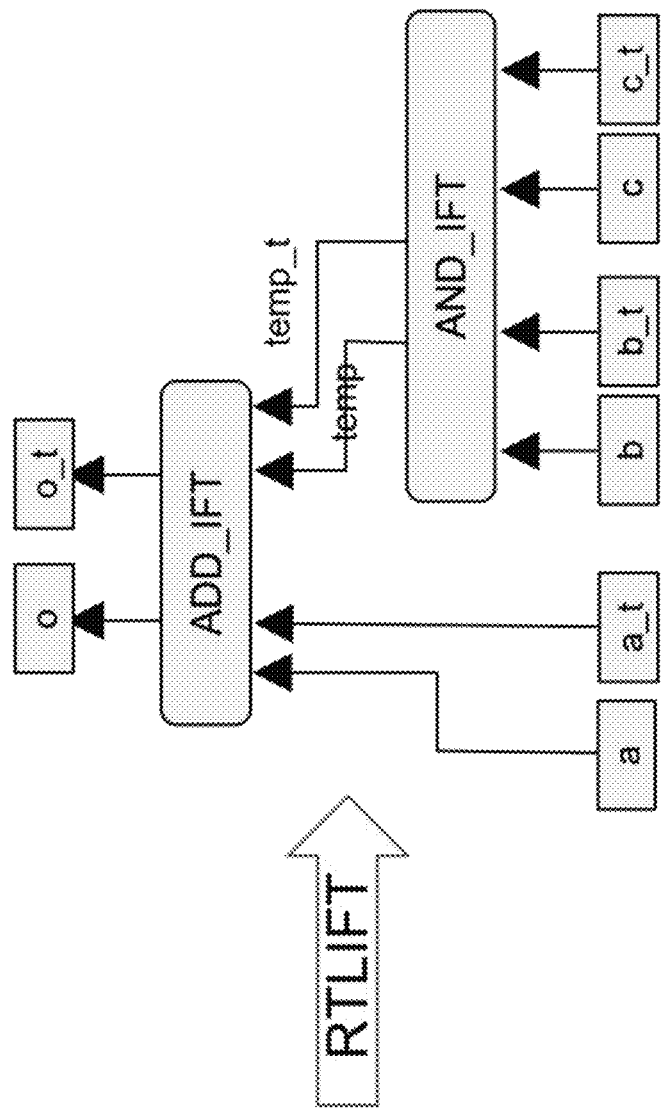
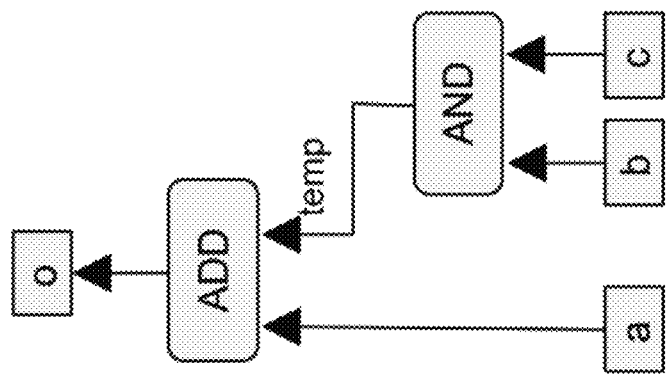
FIG. 12D

```
if(c)
  o1 = e1;
else
  o1 = e2;
```

(a)

```
if(c)
  o1 = e1;
  o1_t = e1_t | c_t;
else
  o1 = e2;
  o2_t = e2_t | c_t;
```

FIG. 13B

```
if(c)
  o1 = e1;
  o1_t = e1_t | (c_t &
    ((e1 ^ e2)_b) (e1^e2)));
else
  o1 = e2;
  o2_t = e2_t | (c_t &
    ((e1 ^ e2)_b) (e1^e2)));
```

FIG. 13C input : verilog code AST file, IFT libraries
input : $flag\_em, flag\_er$
output: IFT instrumented verilog code
1 for each variable $V[n:0]$ do
2    define new variable $V\_t[n:0]$;
3 end
4 for each assignment $Ai$: $Vk ::= Exp(Xi, \ldots, Xj)$ do
5    Traverse the DFG of $Ai$ in order;
6    for each operation $OP$: $Yp = Xm\ OP\ Xn \in Exp$ do
7       instantiate module
          $OP\_IFT\ (Xm, Xm\_t, Xn, Xn\_t, Yp, Yp\_t)$;
8       if $(OP == DFG.root)$ then
9          $Vk := Yp$;
10         $Vk\_t := Yp\_t\ |\ Imp\_Flow(Ai, flag\_em)$;
11       end
12    end
13 end

Algorithm 1: IFT Logic Generation

FIG. 13A input : assignment $A_i$: $V_k ::= Exp(X_1, \cdots, X_j)$
input : $flag\_im$, verilog code AST file
output: Verilog expression ImpFlow 1 Extract $Vk\_Conds$ by traversing CFG of $A_i$;
2 if ($Vk\_Conds == Null$) then
3     ImpFlow $::= 0$;
4 else
5     if ($flag\_im == Imprecise$) then
6         ImpFlow $::=$ ImpFlow $| ci\_t_i | v_i \wedge v_i \in Vk\_Conds$
7     else
8         Extract $OtherInps$ by traversing the CFG;
9         ImpFlow $::= Max\_IFT(Vk\_Conds, OtherInps)$;
10     end
11 end
12 return ImpFlow;

Algorithm 2: Implicit flow tracking logic generation

*FIG. 14*

| Benchamrk | property | RTLIFT | GLIFT |
|---|---|---|---|
| 32bit RSA | Key flows to cipher text | 02:38 | 10:08 |
| 32bit RSA | Key flows to ready | 02:14 | 10:17 |
| 128bit RSA | Key flows to cipher text | 9:43 | timeout |
| 128bit RSA | Key flows to ready | 9:36 | timeout |
| AES_T100 | Key leaks to output | 01:05 | 06:48 |
| AES_T1000 | Key leaks to output | 01:06 | 6:49 |
| AES_T1100 | Key leaks to output | 01:07 | 6:46 |
| AES_T1200 | Key leaks to output | 01:06 | 6:50 |

TABLE I: Verification Time.

*FIG. 15*

| Operation | RTLIFT | | GLIFT | | |
|---|---|---|---|---|---|
| | #tainted flows | Area | #tainted flows | Area | %FP |
| 8-bit adder | 8477103 | 271 | 8535900 | 222 | 5.6% |
| 16-bit adder | 16441632 | 603 | 16524855 | 556 | 7.9% |
| 32-bit adder | 32385907 | 1215 | 32549597 | 1243 | 15.6% |
| 8-bit multiplier | 15029971 | 847 | 15310281 | 1759 | 26.7% |
| 16-bit multiplier | 31816947 | 2078 | 32200870? | 7647 | 36.6% |
| 4-way case | 849874 | 70 | 883810 | 54 | 3.2% |
| 8-way case | 869915 | 226 | 958070 | 129 | 8.4% |
| 16-way case | 869799 | 199 | 997874 | 289 | 12.2% |

TABLE II: Precision & complexity of RTLIFT vs. GLIFT.

*FIG. 16*

TECHNIQUES FOR IMPROVING SECURITY OF CIRCUITRY DESIGNS BASED ON A HARDWARE DESCRIPTION LANGUAGE

CROSS REFERENCE TO RELATED APPLICATIONS

This patent document claims priority to, and the benefits of, U.S. Provisional Patent Application No. 62/642,966, entitled "TECHNIQUES FOR IMPROVING SECURITY OF CIRCUITRY DESIGNS BASED ON A HARDWARE DESCRIPTION LANGUAGE (HDL)," filed on Mar. 14, 2018. The entire content of the above patent application is incorporated by reference as part of the disclosure of this patent document.

TECHNICAL FIELD

This patent document is directed generally to a hardware description language.

BACKGROUND

In electronics, a hardware description language (HDL) is a specialized computer language used to describe the structure and behavior of electronic circuits, and most commonly, digital logic circuits. HDLs form an integral part of electronic design automation (EDA) systems, especially for complex circuits, such as application-specific integrated circuits, microprocessors, and programmable logic devices.

SUMMARY

Disclosed are devices, apparatuses, systems, computer readable media, and methods for improving the security of circuitry designs using HDL code. This may be achieved by automatically generating circuitry for tracking timing flows and generic logical flows within hardware designs, thereby enabling the detection of timing leakage.

In one aspect, a computer-implemented method is disclosed. The method includes receiving a hardware design language (HDL) representation of a circuit; inserting flow tracking into the HDL representation, wherein the flow tracking adds one or more security labels to signals propagating through the circuit to enable tracking of the signals during the propagating; and generating an enhanced HDL representation of the circuit, wherein the enhanced HDL representation comprises the HDL representation and the flow tracking, wherein the enhanced representation including the one or more security labels enables a security determination of the HDL representation.

In another aspect, an apparatus for improving security of a hardware design is disclosed. The apparatus includes at least one processor, and at least one memory. The memory includes instructions that when executed by the at least one processor cause at least the following operations: receiving a hardware design language (HDL) representation of a circuit; inserting flow tracking into the HDL representation, wherein the flow tracking adds one or more security labels that are tracked throughout the circuit; and generating an enhanced HDL representation of the circuit, wherein the enhanced HDL representation comprises the HDL representation and the flow tracking, wherein the enhanced representation including the one or more security labels that are tracked throughout the circuit enables a security determination.

In another aspect, a non-transitory computer readable medium is disclosed. The computer readable medium includes instructions that when executed by a processor, cause at least: receiving a hardware design language (HDL) representation of a circuit; inserting flow tracking into the HDL representation, wherein the flow tracking adds one or more security labels that are tracked throughout the circuit; and generating an enhanced HDL representation of the circuit, wherein the enhanced HDL representation comprises the HDL representation and the flow tracking, wherein the enhanced representation including the one or more security labels that are tracked throughout the circuit enables a security determination.

The following features can be included in various combinations. The HDL representation comprises at least one an operation. The HDL representation comprises at least one conditional assignment. The HDL representation is an abstract syntax tree (AST). The security determination includes a determination of an isolation of the HDL circuit from other circuits. The security determination includes a determination of a confidentiality, wherein the confidentiality indicates untrusted listeners cannot observe information related to the circuit. The security determination includes a determination of an integrity, wherein the integrity indicates unauthorized modification of sensitive information cannot be performed. The AST comprises a plurality of registers, the method further comprising: enumerating a number of paths to each register of the plurality of registers; and/or enumerating a number of controllers of each register of the plurality of registers. The method may further include inserting a buffer at an output of at least one of the plurality of registers. The method may further include extracting a control flow graph representation of the circuit from the AST; and/or traversing the control flow graph to identify each of a plurality of conditional assignments. The method may further include extracting a data flow graph representation of the circuit from the AST; and/or enumerating the each of a plurality of operations based on the data flow graph. The flow tracking is available as an HDL design module in computer aided design tool.

The above and other aspects and features of the disclosed technology are described in greater detail in the drawings, the description and the claims.

BRIEF DESCRIPTION OF THE DRAWINGS

FIG. 1 shows an example of a timing leakage channel and its blockage in a HDL.

FIG. 3A shows an example code snippet, and FIGS. 3B and 3C show an abstract syntax tree (AST) and a control flow graph (CFG) corresponding to the example code snippet.

FIG. 5 shows an algorithm of an example for improving the security of circuitry designs using HDL code.

FIGS. 6A and 6B show an example original HDL code snippet and the information flow tracking (IFT)-enhanced version, respectively.

FIG. 7 shows a table that summarizes the designs and security properties tested using embodiments of the disclosed technology.

FIGS. 11A-11B depict examples of flow tracking libraries.

FIG. 12D depicts an example of how RTLIFT can change a design schematic.

FIG. 13A depicts an example of implicit flow tracking of Verilog code.

FIG. 13B depicts an example of implicit flow tracking of imprecise IFT-extended Verilog code.

FIG. 13C depicts an example of implicit flow tracking of precise IFT-extended Verilog code.

FIG. 14 depicts an example of logic for tracking the implicit flow.

FIG. 15 depicts an example of a verification table.

FIG. 16 depicts an example of a complexity and precision table.

Figure 2:
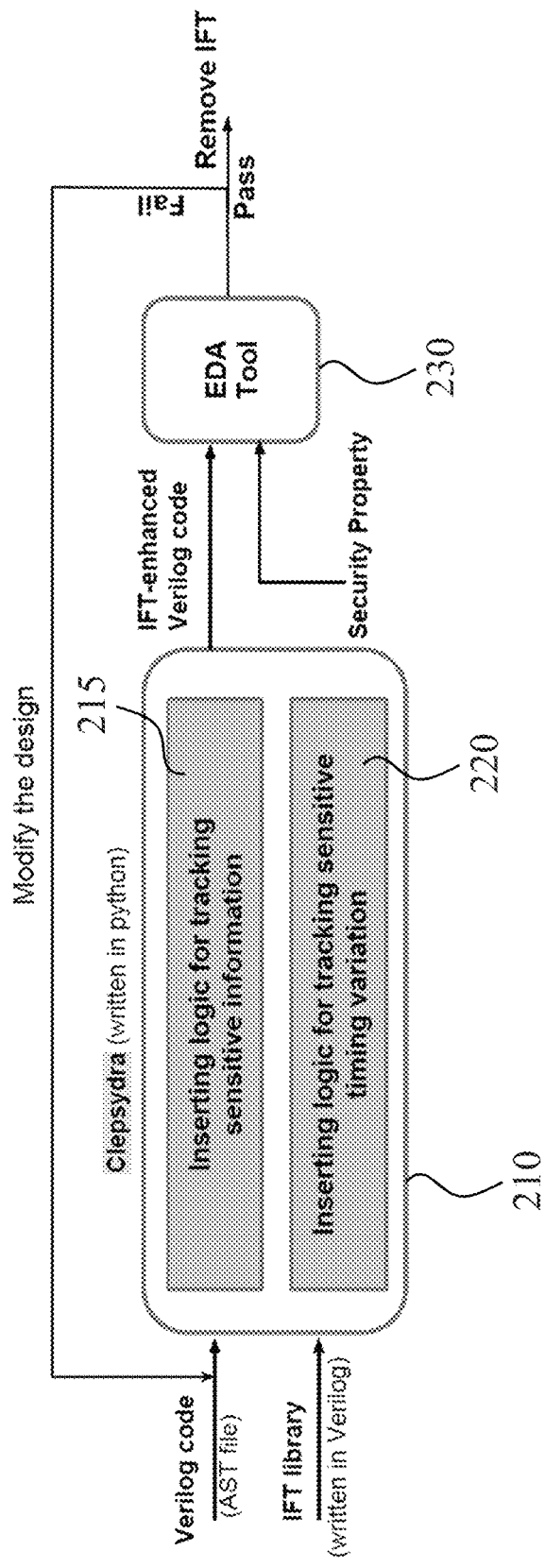
FIG. 2 shows a top-level block diagram of an example of an embodiment for improving the security of circuitry designs using HDL code.

Additional drawings are included in the attached appendices, which form a part of the present patent document.

DETAILED DESCRIPTION

Disclosed are devices, systems and methods for improving the security of circuitry designs using HDL code.

The complexity of modern microelectronic circuit designs has given rise to the concept of circuit modeling, whereby transistor-level behaviors may be represented by Hardware Description Language (HDL) constructs, including but not limited to Verilog-A, VHDL, VHDL-AMS, Verilog-AMS, Verilog, SystemC, and other HDL languages. These behavioral models allow significantly faster simulation times than conventional transistor simulation models (e.g., SPICE™). HDL modeling is typically used as part of a standard circuit design flow to provide a representation of circuit behavior.

Variations in the time taken by a computational unit (written, for example, in HDL) to generate results form a leakage channel that carries information regarding the data being processed. Many implementations of cryptographic algorithms are shown to have a varying runtime based on the Boolean value of secret key. Thus, an attacker familiar with the underlying algorithm can leverage statistical methods to extract the key from timing measurements.

Most methods to protect against hardware-based timing leakage rely on manual inspection of the HDL code, e.g., looking for sources of timing variation such as branches conditioned on secret values or data-dependent requests sent to shared resources. This can be a lengthy and cumbersome task, and it provides no formal guarantee regarding the design's security.

Furthermore, such analysis only inspects the design with respect to already-known attack vectors and falls short in providing resilience against all possible timing-based threats. Exhaustively testing the design to capture timing variations is also becoming impractical due to scale of modern chips. As the complexity and prevalence of hardware designs grow, so does the need for automatic and formal analysis of security properties.

Several techniques for incorporating security analysis into traditional hardware verification tools have been proposed. Many of the proposed techniques enable the designers to verify security properties regarding confidentiality, integrity, and non-interference based on the notion of information flow tracking (IFT).

The disclosed technology provides embodiments show how timing flows can be precisely modeled and provide an IFT technique for capturing timing leakage of hardware designs. In some embodiment, the model is based on detecting and propagating sources of potential timing variations in the code by inspecting interfaces of design's registers.

Some embodiments of the disclosed technology are named Clepsydra, which automatically generates the logic that may be required for tracking timing flows and logical flows in arbitrary HDL codes. The logic generated by Clepsydra can be processed by conventional EDA tools in order to analyze timing properties of the design under test. As this logic is generated after statically analyzing all the execution paths in the design, it does not rely on activating the worst-case execution path of the design in order to expose timing variation during verification.

Clepsydra is easily adoptable in the hardware design flow. It does not employ any additional HDL language features. In some embodiments, it may generate synthesizable logic that could be used for runtime detection. In other embodiments, its usage may primarily be during design time, when the Clepsydra logic is analyzed by EDA tools to verify the existence (or lack thereof) of timing-based properties. In yet other embodiments, the Clepsydra logic is only used for analysis and is discarded before manufacturing, and therefore imposes no additional runtime overhead. Clepsydra may be used to detect timing leakage in various existing architectures or prove that they have constant execution time.

Some embodiments of the disclosed technology provide (1) modeling timing-based information flows in hardware designs, (2) developing Clepsydra for automatic generation of digital logic for testing timing behavior of hardware designs, and (3) analyzing timing-based security properties of various hardware architectures using Clepsydra.

Overview of Information Flow Tracking (IFT)

Isolation of different logical components is a primary security property that hardware designers seek to provide. Two major security properties can be enforced through isolation:

Confidentiality: Preventing untrusted parties from observing secret information by isolating the units which process secret data. For example, cryptographic hardware may want to ensure that the secret key does not leak to public outputs as a result of design flaws, hardware Trojans or side channel leakage.

Integrity: Preventing unauthorized parties from modifying sensitive information. For instance, the registers storing crypto-graphic keys should only be accessible by trusted sources.

In order to provide sound security guarantees, information flow may be analyzed through both data channels (also known as functional channels) and timing channels. The former ensures that data does not move among isolated components, while the latter certifies that the timing footprints of the isolated entities do not form a communication channel.

In some embodiments, IFT techniques provide a systematic approach for verifying security properties related to integrity and confidentiality. This works by assigning security labels to different signals and tracking how these labels propagate through the system. Different security properties can be tested by defining the input labels and inspecting the output labels. Precision of an IFT technique, e.g. how closely the reported flows resemble the actual flows, is directly affected by the label propagation rules.

If the label propagation rules are not comprehensive enough to capture all forms of digital flows, the design might be inaccurately marked as secure. Information can flow in both explicit and implicit ways. In the explicit form, information flows to the output of an operation which is processing sensitive data. More subtly, data that controls conditional statements can implicitly affects the results.

As an example, in the code "if (c) then x=y+z"; signal "x" is explicitly affected by signals "y" and "z", and implicitly by signal "c". For an IFT technique to be sound and free from false negatives, it should be capable of tracking both implicit and explicit flows.

Furthermore, label propagation rules should detect cases where flow of information is blocked. For example, if certain bits of the secret data is ANDed with zero, there will be no flow from those bits to the output of the AND gate. However, a conservative tracking rule, which assigns the highest security labels of the inputs to the output, marks all the output bits as sensitive. In contrast, a precise IFT tool, built upon stricter rules which take into account Boolean values of the operands and the operation functionality, can recognize absence of flows and avoid certain false positives.

In some embodiments, IFT techniques may track both functional flows and timing flows using the same set of labels and propagation rules. Thus, when a flow is detected, whether it is a functional flow or a timing flow, remains unknown. However, different applications necessitate different forms of isolation. For instance, both timing and functional isolation should be guaranteed when a cache is shared among mutually untrusting processes.

In other embodiments, a secure implementation of a cryptographic algorithm only requires elimination of timing channels as functional flows are protected by encryption. This property cannot be tested using IFT techniques which capture all forms of logical flows through a single set of labels. As the cipher is always affected by the secret key through functional flows, its security label will be raised to the security label of the key, independent of existence of timing flows. This may significantly limit employment of IFT techniques for security analysis as similar scenarios happen in many applications where functional flows are inevitable but timing-based flows should be eliminated.

Since conventional IFT techniques are designed for tracking all forms of logical flows, employing them to detect only timing flows results in a considerable number of false positives. As timing flows are a subset of information flows; a set of stricter propagation rules can be designed that work on a separate set of labels and track only timing flows while ignoring functional ones.

Characterization of Timing Flows

Timing flows exist from inputs to outputs of a circuit if the time that is taken for the outputs to become available depends on the Boolean values of the inputs. In some embodiments, these flows can be exploited if the input signals causing them to contain secret information, and the completion time of the unit can be measured by an untrusted party.

For example, consider a division unit, as shown in FIG. 1, implemented via consecutive subtraction of the divisor from the dividend. The execution time of this algorithm depends on the input values as the number of subtractions is not fixed. This indicates that even if the Boolean value of the quotient is undisclosed, evaluating the execution time reveals information regarding the inputs.

Completion time of a design is defined by the time when its output is updated to its final value. If no timing flow exists from input X to output Y, the time taken for Y to reach its final value should be constant as X changes. Thus, in order to detect timing flows, it must be determined whether or not the updates made to the outputs occur at constant timesteps. This may be addressed by detecting variations in the update time of all design variables and tracking them to the final outputs. In some embodiments, this may be done for any arbitrary digital circuit by answering three questions: How are timing flows generated from a set of sensitive inputs? How does the flow propagate once generated? And lastly, what are the necessary conditions for blocking the flow of timing information and enforcing constant time execution? Since timing variations are to be detected in terms of clock cycles, the design's registers and the signals which control them are analyzed.

In some embodiments, a hardware design's registers are written to by a set of data signals which are multiplexed by controllers at each cycle. In an example, a register where none of its data or control signals has timing variation but might contain sensitive data is considered, and the circumstances under which timing variations occur at the register's output are to be explored. If the register is definitely updated at each clock cycle, there will be no timing variations. However, if occurrence of updates are tentative, i.e. there is a degree of freedom for the register to hold its current value or get a new value, timing variation could occur. If the controller signal which is deciding the occurrence of the update is sensitive, the resulting timing variation will contain sensitive information as well.

In the example shown in FIG. 1, the updates made to the register "temp_quotient" are conditioned on the input (120). Thus, based on the Boolean values of the input signals, this register might get its final value at different times. In some embodiments, detecting conditional updates caused by sensitive data soundly captures all timing flows while discarding functional-only ones.

If any of the data or control signals of a register has cycle level variations, the variation can flow through the register. While simply propagating these flows soundly exposes all timing variations, it overestimates the flow when mitigation techniques are implemented to eliminate the variations. In other words, the ability to detect situations where timing variations are not observable at a register's output even though they are present at its input may be required.

In the example shown in FIG. 1, instead of directly writing the "temp_quotient" to the output, a wait period is taken before updating the output value (110). If the wait period is longer than the worst-case execution time, the output gets its update at constant time steps.

In some embodiments, if there exists a non-sensitive control signal which fully controls the occurrence of updates to a register, it can block flow of timing variation from input to output of the register. Fully controlling control signal implies that the register gets a new value if and only if the controller gets a new value. Thus, the timing signature of the register output is identical to the control signal (with a single cycle delay) and is independent of its input. Implementing this policy reduces the number of false positives to some extent without imposing any false negative.

In the example shown in FIG. 1, if the counter is large enough, the output value changes immediately after the done condition is updated and keeps its old value while done does not change. Hence, all the variations to the final output are controlled by the done signal which is non-sensitive, indicating constant execution time with respect to inputs.

Robustness of Characterization Capabilities

Some embodiments of the Clepsydra implementation disclosed in this document are able to discover all possible timing channels, and this may be proven by showing that detecting tentative updates of design's registers is adequate for exposing all timing variations, and the presence of non-sensitive fully controlling signals eliminates existing timing variations. It is also proven that some embodiments ignore functional-only flows and are more precise for analyzing timing-based properties compared to IFT techniques which capture all logical flows.

Definition 1. An event e over data set Y and time values T is shown as the tuple $e=(y, t)$ for $y \in Y$ and $t \in T$, where y and t can be retrieved by functions val(e) and time(e). If y is an n-dimensional vector, and t the number of clock ticks that has past, the inputs or outputs of a design with n ports can be represented by event e.

Definition 2. Trace A(Y,n) represents n events $\{e_i\}_{i=1}^n$ over data set Y, which are ordered by time: time($e_i$)=time($e_{i+1}$)+1.

Definition 3. For any trace A(Y, n), its distinct trace d(A) is defined as the longest sub-trace of A, where consecutive events have different values, and for any two consecutive events in A such that val($e_i$)≠val($e_{i-1}$), $e_i$ is in d(A).

For example, for trace A={(10, 1), (10, 2), (20, 3), (20, 4)}, its distinct trace is d(A)={(10, 1), (20, 3)} since the values only change at clock cycle 1 and 3.

Definition 4. Traces A(X, k) and A'(X, k) are value preserving with respect to set I if the only difference between their corresponding events $e_i$ and $e'_i$ is in the j-th element of the value vector such that $j \in I$.

In IFT analysis, the effects of a set of sensitive variables may be analyzed by testing the design with respect to input traces which only differ in the sensitive inputs. This idea may be modeled by using value preserving traces where I is the set of sensitive inputs.

Definition 5. Output of an FSM F is completely controlled by input J if the FSM output is updated if and only if input J is updated.

Definition 6. For any set of wires W, sensitivity label set $W_s$ and timing label set $W_t$ indicate if W carries sensitive information or timing variation, respectively.

Definition 7. In a sequential circuit represented by the FSM F=(X, Y, S, $s_0$, δ, α), a functional-only flow from a set of sensitive inputs I exists if there exist two value preserving (with respect to I) input traces A(X, k) and A'(X, k) such that when fed to the FSM, the timesteps of the distinct traces of the outputs are equivalent, while the values of corresponding events varies. Stated formally, if B=α(A, $s_0$) and B'=α(A', $s_0$), then:

$$\forall e_i, e'_i \in d(B) \text{ time}(e_i) = \text{time}(e'_i) \text{ and} \qquad \text{Equation 1}$$

$$\exists e_j, e'_j \in d(B), \in d(B) \text{ such that val}(e_j) \neq \text{val}(e'_j) \qquad \text{Equation 2}$$

Definition 8. In a sequential circuit represented by the FSM F=(X, Y, S, $s_0$, δ, α) a timing flow from a set of sensitive inputs I exists if there exist two value preserving (with respect to I) input traces A(X, k) and A'(X, k) such that when fed to the FSM, the timestep of the distinct traces of the outputs are not equivalent. Stated formally, if B=α(A, $s_0$) and B'=α(A, $s_0$), then:

$$\exists e_j, e'_j \in d(B), \in d(B) \text{ such that time}(e_j) \neq \text{time}(e'_i) \qquad \text{Equation 3}$$

Definition 9. For a combinational logic function $f: X \rightarrow Y$ its flow tracking function $f_s: X \times X_s \rightarrow Y_s$ determines whether or not sensitive inputs affect the outputs. If $f(x_1, \ldots, x_n)=(y_1, \ldots, y_m)$ then $f_s(x_1, \ldots, x_n, x_{1s}, \ldots, x_{ns})=(y_{1s}, \ldots, y_{ms})$, where if set of sensitive inputs $\{x_j | x_{js}=1\}$ can affect value of $y_i$ then $y_{is}=1$ indicating information flow exists from the sensitive inputs to output $y_i$.

Definition 10. For a sequential logic function $f: X \times S \rightarrow Y$, where X, S, Y are the inputs, states, and the outputs, the time tracking function $f_t: X \times X_s \times X_t \times S \times S_s \times S_t \rightarrow Y_t$ determines if a set of inputs tainted with sensitive information or timing variation can affect timing variations of the output. If $f(x_1, x_2, \ldots, w_n, s_1, s_2, \ldots, s_1)=(y_1, y_2, \ldots, y_m)$ then $f_t(x_1, \ldots, x_n, x_{1s}, \ldots, c_{ns}, x_{1t}, \ldots, x_{nt}, s_1, \ldots, s_{1s}, s_{1t}, \ldots, s_{1t})=(y_{1t}, \ldots, y_{mt})$, where if a set of tainted inputs $\{x_j | x_{js} \vee x_{jt}=1\}$ can affect whether or not state $s_i$ is updated then $s_{it}=1$ and a timing flow exists from the tainted inputs to output $s_i$.

Theorem 1. The time tracking logic $F_t$ of FSM F captures timing flows of the FSM.

Proof. The proof of this theorem shows that the existence of a timing flow reduces to variations in occurrence of updates to the output, and therefore is captured by $F_t$.

If a timing flow exists with respect to the set of tainted inputs I, based on Definition 8 there exist value preserving traces A(X, k), A'(X, k) such that: if B=α(A), d(B)=($e_1$, $e_2$, ..., $e_m$) and B'=α(A'), d(B')=$e'_1$, $e'_2$, ..., $e'_m$) then: $\exists j \in [1:m]$ such that time($e_j$)≠time($e'_j$)

Consider n to be the smallest index such that time($e_n$) ≠time($e'_n$). Without loss of generality, it is assumed that time($e_n$)=$t_n$ and time($e'_n$)=$t_n$+d, d>0. Basically, it is being assumed that n is the time when the new value of trace B' appears with delay d compared to trace B. The elements of these two traces may be written up to the nth element:

$$d(B)=(v_1,t_1),(v_2,t_2), \ldots (v_{n-1},t_{n-1}),(v_n,t_n) \qquad \text{Equation 4}$$

$$d(B)=(v'_1,t_1),(v'_2,t_2), \ldots ,(v'_{n-1},t_{n-1}),(v'_n,t_n+d) \qquad \text{Equation 5}$$

$$\forall i \in [2:n]: v_i \neq v_{i-1} \text{ and } v'_i \neq v'_{i-1} \text{ based on Definition 3.} \qquad \text{Equation 6}$$

The following observations can be made based on the above traces: (a): $(v_n, t_n)$ and $(v_{n-1}, t_{n-1}) \in B$, and (b): $(v'_{n-1}, t_n)$ and $(v'_{n-1}, t_{n-1}) \in B'$ From (a) it may be inferred that the value of trace B is updated at time $t_n$ from $v_{n-1}$ to $v_n$ while equation (b) shows that value of trace B' is not updated at time tn and is equal to $v_{n-1}$.

By Definition 4, all input events remain the same $\forall_i \notin I$, meaning that the only difference between them is the sensitive inputs. Thus, the difference in the update to the output is caused by the set of sensitive inputs and is captured by $F_t$ based on Definition 10.

Theorem 2. The time tracking logic $F_t$ of FSM F does not capture functional-only flows of the FSM.

Proof. This theorem is proved by showing that the existence of functional only flows will not impose any variations on the occurrence of updates to the output, and thus will not be captured by $F_t$.

If a functional-only flow exists with respect to the set of sensitive inputs I, then based on Definition 7 there exists value preserving traces A(X, k), A'(X, k) such that: if $B=\alpha(A)$, $d(B)=(e_1, e_2, \ldots, e_m)$ and $B'=\alpha(A')$, $d(B')=(e'_1, e'_2, \ldots, e'_m)$ then: (1) $\forall_i \in [1:m]:\text{time}(e_i)=\text{time}(e'_i)$, (2) $\exists j \in [1:m]$: such that $\text{val}(e_j) \neq \text{val}(e'_j)$ It is claimed that there is no time $t_n$ such that the value of one of the traces is updated while the other one is not. Without loss of generality, it may be shown that there is no time $t_n$ where the value of B is updated but the value of B' remains the same. This is proven via proof by contradiction.

Contradiction hypothesis: At time $t_n$, trace B is updated while trace B' holds its value. Let $v_n$ and $v_{n-1}$ be the values of trace B at times $t_n$ and $t_{n-1}$ respectively. Based on the contradiction hypothesis, $(v_n, t_n)$ is an event in B. Hence, d(B) contains an event $e_i$ such that $\text{time}(e_i)=t_n$. Let us assume that $e_i$ is the ith element of d(B). Similarly, assume values of trace B' in times $t_n$ and $t_{n-1}$ are $v'_n$ and $v'_{n-1}$. Based on the contradiction hypothesis, it is known that $(v'_n, t_n)$ is not an event in d(B) since B is not updated at this time. Thus, d(B') does not have any event $e'_j$ which timestep is $t_n$. Hence, if the ith element of d(B') is selected, called $e'_i$, then $\text{time}(e'_i) \neq t_n$. So: $\exists i$ in$[1:m]$ such that $\text{time}(e_i) \neq \text{time}(e'_i)$.

This is contradictory to the definition of functional-only flows since there could be no time $t_n$ where the values of one of the traces is updated while the other one is not. Based on Definition 10 this is not captured by $FSM_t$.

Theorem 3. If FSM F is completely controlled by input J such that $J \not\in I$, then no timing variation is observable at the output of FSM F as a result of processing traces which are value preserving with respect to set I.

Proof. This theorem is proven via proof by contradiction.

Contradiction hypothesis: there exist value preserving (with respect to I) traces A(X, k) and A'(X, k) which impose timing flow at the output of FSM F which is completely controlled by input $J \not\in I$.

Based on Definition 8: let $B=\alpha(A, s_0)$, and $d(B)=\{e_1, e_2, \ldots, e_m\}$, let $B'=\alpha(A', s_0)$, and $d(B')=\{e'_1, e'_2, \ldots, e'_m\}$, $\exists i \in [1, m]$ such that $\text{time}(e_i) \neq \text{time}(e'_i)$, let n be the smallest index in the above equation such that $\text{time}(e_i) \neq \text{time}(e'_i)$. Without loss of generality, it may be assumed that $\text{time}(e_i) = t_n$ and $\text{time}(e'_i)=t_n+d$. The elements of d(B) and d(B') up to the nth element can be written as: $d(B)=(v_1, t_1)$, $(v_2, t_2), \ldots, (v_{n-1}, t_{n-1}), (v_n, t_n), d(B')=(v'_1, t_1), (v'_2, t_2), \ldots, (v'_{n-1}, t_{n-1}), (v'_n, t_{n+d})$.

Using Definition 3, the following observations may be made: (a): $(v_n, t_n)$ and $(v_{n-1}, t_{n-1}) \in B$, and (b): $(v'_{n-1}, t_n)$ and $(v'_{n-1}, t_{n-1}) \in B'$.

The above equations specify that trace B has been updated at time $t_n$ while B' is not updated. Denote the sub-trace of the fully controlling input J from traces A and A' with j and j', respectively. Based on Definition 5, equation (a) indicates that input j is updated at time $t_n$, and from (b) it is known that input j' is not updated at this time. This is a contradiction as the only difference between input traces A and A' are with respect to set I, and since $J \not\in I$ then j and j' should be identical.

FIG. 2 shows a top-level block diagram of an example of an embodiment, referred to as Clepsydra, for improving the security of circuitry designs using HDL code. As shown FIG. 2, the input to Clepsydra is a hardware design described by its abstract syntax tree (AST) which is obtained by parsing its HDL representation. As output, Clepsydra generates a synthesizable Verilog code which has all the functionalities specified in the original design, alongside the complementary logic for propagating both timing based and generic information flows from design inputs to its outputs.

The tracking logic (210) is realized in two steps: 1) extending each variable in the design with labels sensitivity level and timing level which indicate if the variable carries sensitive information (215) or timing variation (220), respectively; and 2) inserting logic for updating these labels as their corresponding variables change. The code generated by Clepsydra is then given to EDA tools (230) for security analysis. Security properties are assessed by specifying labels of the input variables and observing the output labels after simulation, formal verification or emulation. If the output labels comply with the designers' intention, the tracking logic is discarded, and the original design can be used for fabrication. In case of violating the security properties, the original design should be modified, fed to Clepsydra, and retested.

In some embodiments, Clepsydra enables analyzing timing behavior of a design with respect to any arbitrary subset of its inputs which are marked as sensitive. This facilitates modeling a variety of security properties. For example, constant time execution can be tested by marking all the inputs as sensitive. But in many scenarios, there may be interest in constant execution time with respect to certain inputs. For instance, when a cache is shared between mutually untrusting processes, timing variations caused by accesses from sensitive data is exploitable. However, variations due to cache conflicts on non-sensitive data are not valuable to the adversary. indiscriminately eliminating all timing variations results in disabling the cache as a whole. Moreover, many mitigation techniques are based on randomizing timing variations. To differentiate benign variations from sensitive ones, the source of the variations may be inspected. This is done by tracking sensitive data throughout the circuit and extracting the sensitive timing variations from them.

Figures 4A, 4B:
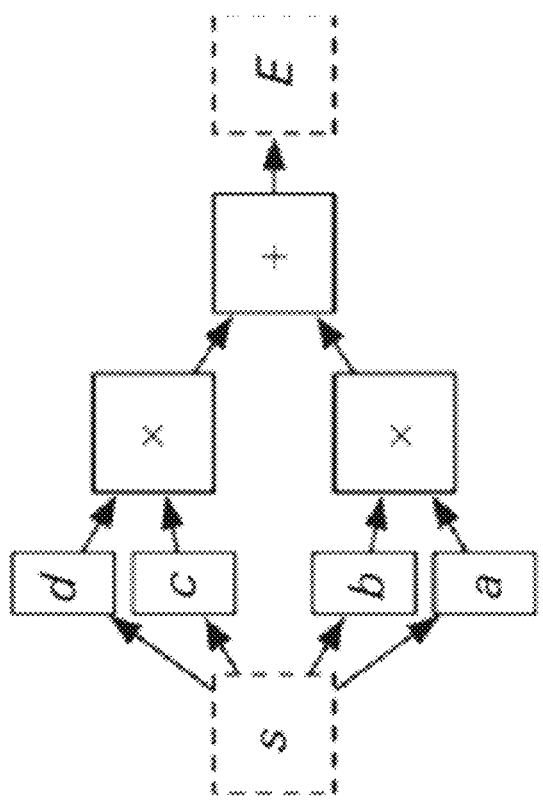
FIGS. 4A and 4B show another example code snippet and the corresponding data flow graph (DFG), respectively.

FIG. 3A shows an example code snippet, and FIGS. 3B and 3C show an abstract syntax tree (AST) and a control flow graph (CFG) corresponding to the example code snippet, respectively. FIGS. 4A and 4B show another example code snippet and the corresponding data flow graph (DFG), respectively.

As shown in FIGS. 3A-3B and 4A-4B, the AST, CFG and DFG constitute different structural representations of a code snippet. In some embodiments, the different structural representations enable different properties of the code to be enumerated. For example, the CFG may be used to identify conditional assignments, whereas the DFG may be used to identify Boolean operations.

FIG. 5 shows an algorithm of an example for improving the security of circuitry designs using HDL code. In an example, the algorithm shown in FIG. 5 is the tracking logic generation that may be used in an embodiment of the disclosed technology.

Sensitive information affects computation result through both the data path and the control path, creating explicit and implicit flows. To detect explicit flows, Clepsydra replaces each data path operation with an IFT-enhanced version of which is available as a Verilog module in a predesigned IFT library (lines 11-13 of Algorithm 1 in FIG. 5). Each IFT-enhanced operation receives the original inputs of the operation along with their sensitivity labels, and computes the outputs of the operation as well as their sensitivity labels.

To track whether or not an assignment is implicitly affected by sensitive data, it may be necessary to determine whether its execution depends on any sensitive variable. To do so, Clepsydra extracts the design's control flow graph from its AST representation, and constructs a list of control signals for each conditional assignment (lines 6-8 of Algorithm 1 in FIG. 5). Next, based on the variables in the list and their sensitivity labels the logic for tracking the implicit flow is generated and added to the explicit flow tracking logic (lines 18-20 of Algorithm 1 in FIG. 5).

In some embodiments, Clepsydra inserts logic components at each register interface to detect if any timing variation is generated from sensitive data, and whether or not existing variations from the register input flow to the register's output (lines 21-22 of Algorithm 1 in FIG. 5). Note that the necessary condition for formation of timing variation is existence of a register which update depends on sensitive values. To identify these cases, determine whether a register has the flexibility of selecting between getting a new value and holding its current value. To examine this property for each register in the design, Clepsydra statically enumerates all the paths in which the register is written to and compares it with the total number of paths that the controllers of that register can activate. If these two numbers are unequal, a bit which indicates the updates to the register are tentative is set (lines 1-5 of Algorithm 1 in FIG. 5).

Such analysis on a Verilog code is relatively easy compared to software languages since multiple writes to a register are modeled as a single multiplexer with n data inputs and m control inputs. Tentative update scenarios happen if $n \neq 2^m$ which indicates that the multiplexer has direct feedback from its output to its own input.

In other embodiments, and since the updates to the control signals are observable at the register output with one cycle delay, Clepsydra may insert buffers to store control values from the previous cycle in order to compute whether or not they have been updated in the previous cycle (lines 16-17 of Algorithm 1 in FIG. 5).

FIGS. 6A and 6B show an example of the original Verilog code written and the IFT-enhanced Verilog code generated by Clepsydra, respectively. The first line of FIGS. 6A and 6B shows a simple example of replacing an add operation with an IFT-enhanced module is shown in the first line of FIG. 6A-6B. Various complexity-precision trade-offs for the tracking logic can be explored by modifying the label propagation rules of the IFT-enhanced modules.

Highlighted parts in lines 9 and 20 in FIG. 6B show the logic responsible for detecting generation of timing flows. Values of A_bal and Y_bal are statically decided by Clepsydra after analyzing the branches in the original code. An XNOR function is also added to detect cases where the register gets its value from a different variable without actually getting updated. Even though such scenarios are rare in actual designs, the logic for detecting them is added to ensure capturing cases where tentative updates are disguised by renaming the variables.

Once generated, timing variations flow directly through the subsequent registers unless special mechanism for eliminating the variations is implemented. Register X in FIGS. 6A-6B directly gets its value from register A, thus if any timing variation is present as the output of A, it will unconditionally flow to X. As shown in the second line of FIG. 6B, timing variation directly flows through combinational logic, in an example of cycle level precision. To detect existence of fully controlling signals for conditional assignments to registers, Clepsydra inserts XOR gates for comparing occurrence of updates. This logic is shown in lines 11 and 22 of FIG. 6B. The XOR function indicates that updates of the output register and its controller are synchronous. And the inverters specify that the controller does not have any sensitive information. This logic is responsible for preventing overestimating the flow to some extent as depicted by the AND function. The logic behind Y_up, A_up, B_up and done up are computed by XORing the current state with the next state.

The disclosed technology has been tested experimentally, and this document elaborates how various security properties are specified based on the notion of IFT, and verified using the embodiments described herein. The table in FIG. 7 lists the hardware designs that were tested along with the assessed security properties. For each design, the architectural features which create timing channels, the attack model for exploiting them, the existing mitigation techniques, and the results of the security analysis are briefly discussed. In each of the experiments, the AST representation of plain Verilog code is generated by parsing it using Yosys tool, and Clepsydra is employed to generate tracking logic. On the IFT-enhanced code generated by Clepsydra, effect of input X on timing behavior of output Y can be inspected by setting the input signal X_s as high and observing the value of the output Y_t after simulation or formal verification. FIG. 7 tabulates a summary of the designs and security properties tested using embodiments of the disclosed technology, including Clepsydra.

Arithmetic modules. The first set of experiments focus on proving constant time properties of arithmetic units, as variation in completion time of these units can be exploited to extract information regarding the input. The fixed-point math library from the Opencores website was tested, which is supposed to run in constant time as claimed by its designers. In order to verify this claim, data inputs of each unit were marked as sensitive and the timing labels of the outputs were observed.

The multiplication unit is based on accumulating partial products at each cycle. Thus, if the MSB bits of the multiplier are zero the result will be available faster since the partial products in the last cycles are zero. The output "ready" signal of the design is set after a counter reaches zero. After analyzing this design, it was noticed that while the "ready" output is free from timing variations, the product result is not. This indicates that the result could potentially become available before the "ready" signal is raised.

In order to eliminate this flow, the design was modified by adding a register which blocks the working result to write to the final output before the counter resets. After this modification, it could formally be proven that the design runs in constant time using Questa Formal Verification tool. The division unit, similar to the example shown in FIG. 1, is implemented by subsequently subtracting the divisor from the dividend. Similar to the multiplication unit, a wait state is responsible for enforcing constant time updates at the final outputs. As a result, no timing variation were detected as all the output variables, including the result itself, are controlled by the wait state.

This set of experiments shows that embodiments of the disclosed technology are capable of isolating different forms of flows and proving absence of timing flows while functional flows exist. Furthermore, it shows that the generated tracking logic is precise enough to detect cases where timing variations are eliminated by delaying all the updates as long as the worst-case scenario.

Cache implementations. Cache-based side channel attacks have been repeatedly employed to break software implementations of ciphers such as RSA and AES. These attacks target implementations which use pre-computed values that are stored in the cache and accessed based on the value of the secret key. Thus, an attacker who is capable of extracting the cache access pattern of the process running the encryption can deduce information regarding the key. It has been shown that an adversarial process sharing the cache with the OpenSSL implementation of the RSA cipher can retrieve cache access pattern of the victim process by inducing collisions in the cache. By remotely attacking AES implementation of the OpenSSL protocol, it has also been shown that timing channels can be exploited even when the cache is not shared with an untrusted process.

While these attacks vary substantially in terms of implementation, they all exploit the timing variations from the cache collisions. Several cache designs have been proposed to bar index value of sensitive accesses to affect the time that it takes for the cache to retrieve data in later cycles. Embodiments of the disclosed technology were used to inspect timing flows in an unsecure cache and two secure architectures, PLcache and RPcache.

To model timing leakage via external interference, two processes with isolated address spaces sharing the same cache are considered. Marking indexes of accesses made by one process as sensitive, it may be determined if the data read by the other process contains timing variations. The internal interference scenario is modeled with a single process and inspecting if marking certain indexes as sensitive causes timing variation when the same lines are read with different tags.

In some embodiments, PLcache eliminates leakage channel by letting processes to lock their data in the cache and disabling their eviction. Since sensitive data can no longer be evicted, it cannot affect the timing signature of the system. PLcache is implemented and its IFT-enhanced tracking logic is acquired from Clepsydra to test if this partitioning scheme eliminates the flow. Based on our analysis, if data with sensitive indexes is preloaded to the cache and locked, there will be no information leakage as the result of later accesses to the locked lines. However, this result is based on assuming that the preloading stage is not sensitive itself.

In other embodiments, RPcache, which randomly permutes the map-ping of memory to cache addresses to eliminate any exploitable relation between the collisions, is tested. When external interference between untrusting processes are detected, PRcache randomly chooses a cache line for eviction. Thus, the attacker cannot evict the victim's process sensitive information and observe whether or not that causes delay later on. In case of internal interference, collisions are handled by directly sending the data from the colliding access to the processor and randomly evicting another line. Analysis showed that RP-cache eliminates timing variations assuming that the inputs to the random number generator are not sensitive.

Bus architectures. Another source of timing channel in hardware designs arises when different units are connected over a shared bus. In such scenarios, cores that are supposed to be isolated can covertly communicate by modulating the access patterns to a shared resource and affecting the time when other cores can use the same resource.

Embodiments of the disclosed technology are used to inspect the presence of timing flows when WISHBONE interconnect architecture is used to arbiter accesses on a System-on-Chip. To access a shared resource over WISHBONE, the master core sends a request signal, and waits for the arbiter to send back an ack signal. Timing channel between different cores can be assessed by marking the request signal sent by one core as sensitive and observing the timing label of the ack signal sent to the other core in later requests. This scenario is tested for the original WISHBONE arbiter and two modified versions of it.

The original WISHBONE arbiter, implemented by the Opencores community, is based on a round robin algorithm. Experiments revealed existence of timing channel between the cores connected over this architecture as the grant given to one core depends on the former requests sent to the arbiter. In order to eliminate the channel, the round robin arbiter is replaced with a TDMA scheme and retested the design. In this case, no timing channel is detected as the grants are given based on a counter. In order to improve the efficiency of the arbiter, a more flexible scenario is tested where the cores are divided into two different groups. The cores within the same group are arbitrated based on a round robin algorithm, while the two groups are time multiplexed. In this scenario, the experiments showed that the two groups are isolated from each other while timing channel exists between elements of the same group.

Crypto cores. Timing variations in hardware implementations of RSA and AES ciphers are tested. Since the ciphertext is computed from the key, functional flow from the key to the cipher is inevitable. Thus, existing IFT tools cannot be leveraged to inspect existence of timing channels which are not intended by the designer. The experiments tested the existence of a timing channel in two ciphers from the Trusthub benchmarks. The timing flow from the secret key to the ciphertext is assessed by marking the key bits as sensitive and observing the timing label of the output. Using Questa Formal Verification tool, it was proven that the AES core runs in constant time. However, for the RSA core, timing flow was detected from the secret key to the cipher as a result of insecure implementation of the modular exponentiation step.

Figure 8:
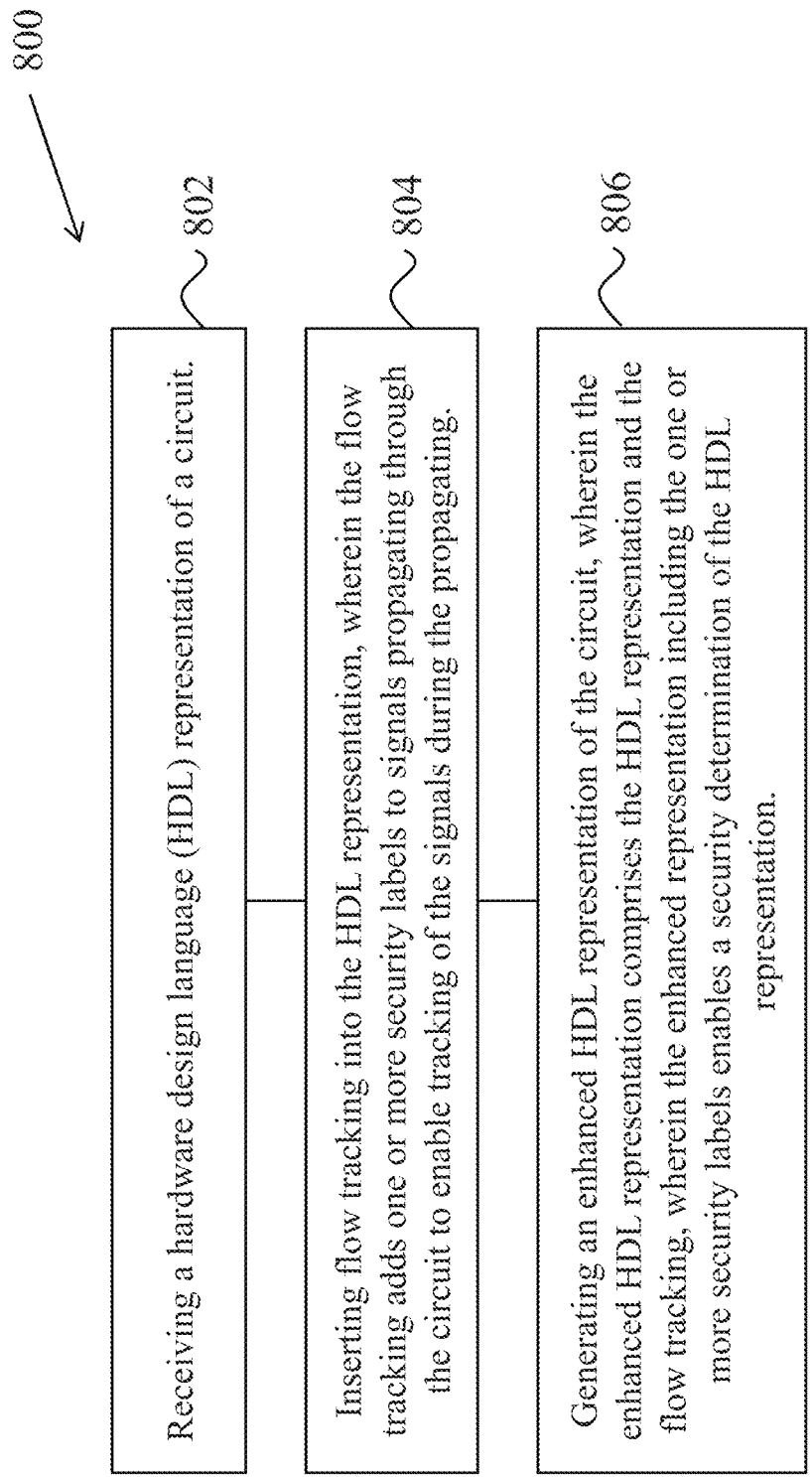
FIG. 8 shows a flowchart of an example for improving the security of circuitry designs using HDL code.

FIG. 8 shows a flowchart of an exemplary method 800 for improving the security of circuitry designs using HDL code. At 802, a hardware design language (HDL) representation of a circuit is received. The receiving operation may include, for example, reading the HDL representation from a computer file or a network location. At 804, flow tracking is inserted into the HDL representation, wherein the flow tracking adds one or more security labels to signals propagating through the circuit to enable tracking of the signals during the propagating. At 806, an enhanced HDL representation of the circuit is generated, wherein the enhanced HDL representation comprises the HDL representation and the flow tracking, wherein the enhanced representation including the one or more security labels enables a security determination of the HDL representation. In some embodiments, the HDL representation may be described in Verilog-A, VHDL, VHDL-AMS, Verilog-AMS, Verilog, SystemC, and other HDL languages. In some embodiments, an AST representation may be generated by parsing the HDL representation (written, for example, in Verilog) using the Yosys Open Synthesis Suite. The AST representation may include a plurality of operations and a plurality of conditional assignments.

In some embodiments, a control flow graph (CFG) may be extracted from the AST representation of the hardware design. The CFG may be traversed to identify the plurality of conditional assignments. In other embodiments, a data flow graph (DFG) may be extracted from the AST representation. The plurality of operations may be enumerated based on the DFG.

In some example embodiments a method may include replacing at least one of the plurality of operations of the AST with a respective IFT-enhanced operation. In some embodiments, the IFT-enhanced operations may be available as an HDL module in a predesigned IFT library. In other embodiments, the IFT-enhanced operations replace the original HDL operations based on the original HDL operations being part of circuit that exhibits timing variations. The method may further include inserting implicit logic into at least one of the plurality of conditional assignments of the AST. In some embodiments, the replacement by IFT-enhanced operations and insertion of implicit logic may be based analyzing the AST representation. The AST representation may include a plurality of registers, and the analysis may include enumerating the number of paths to one or more of the registers and the number of controllers of one or more registers, as well as inserting a buffer at an output of one or more registers. The method may further include outputting an IFT-enhanced HDL representation of the hardware design comprising the at least one of the plurality of operations with the respective IFT-enhanced operation and the at least one of the plurality of conditional assignments with the respective implicit IFT logic. The outputted HDL representation may be processed by conventional EDA tools in order to analyze timing properties of the design under test. In some embodiments, the outputted HDL representation may only be used for analysis and may be discarded before manufacturing, thereby imposing no additional runtime overhead.

This document discloses devices, methods and systems for tracking timing flows and generic information flows in two separate channels in order to enable analysis of a wider range of security properties.

Variations in the time taken by a computational unit to generate results form a leakage channel that carries information regarding the data being processed. Many implementations of cryptographic algorithms are shown to have a varying runtime based on the Boolean value of a secret key. An attacker familiar with the underlying algorithm can leverage statistical methods to extract the key from timing measurements. In security critical applications, timing-based attacks have targeted various hardware units such as caches, shared buses, and floating-point arithmetic units. Being both inexpensive and pervasive, timing-based side channel attacks are attracting more attention. They can be launched at low cost since the attacker merely needs to measure the execution time of the victim process without physical access to the design. Moreover, any application encompassing data-dependent optimizations is susceptible to such attacks.

Most methods to protect against hardware-based timing leakage rely on manual inspection of the HDL code, e.g., looking for sources of timing variation such as branches conditioned on secret values or data-dependent requests sent to shared resources. This can be a lengthy and cumbersome task, and it provides no formal guarantee regarding the design's security. Furthermore, such analysis only inspects the design with respect to already-known attack vectors and falls short in providing resilience against all possible timing-based threats. Exhaustively testing the design to capture timing variations is also becoming impractical due to scale of modern chips. As the complexity and prevalence of hardware designs grow, so does the need for automatic and formal analysis of security properties. Over the past decade, multiple research solutions have been proposed for incorporating security analysis into traditional hardware verification tools. Many of the proposed techniques enable the designers to verify security properties regarding confidentiality, integrity, and non-interference based on the notion of information flow tracking (IFT).

By modeling how labeled data moves through a system, IFT tools indicate if sensitive information flows to any part of the design. However, this indication is limited to a binary decision as the nature of detected flows are not specified. More specifically, IFT techniques cannot segregate functional flows from timing-based ones. This could be problematic in many security applications where functional flow is expected as it is protected by encryption, while timing flows shall be eliminated. For example, in a crypto core, functional flow from the key to the ciphertext is expected while the designer needs to ensure that the time taken for the ciphertext to become available does not depend on the value of the secret key. Furthermore, it might be the case that the output is not directly accessible by untrusted parties, but its timing footprint is public. For instance, completion time of a shared floating-point arithmetic unit can reveal information regarding its input values, even if the output itself is hidden. Thus, to assess the security of the design with respect to side channel attacks, timing flows should be distinguishable from functional ones.

Using the disclosed subject matter, timing flows can be precisely modeled, and introduce an IFT technique for capturing timing leakage of hardware designs. A model is based on detecting and propagating sources of potential timing variations in the code by inspecting interfaces of design's registers. Clepsydra automatically generates the logic that may be required for tracking timing flows and logical flows in arbitrary HDL codes. The logic generated by Clepsydra can be processed by EDA tools in order to analyze timing properties of the design under test. As this logic is generated after statically analyzing all the execution paths in the design, it does not rely on activating the worst-case execution path of the design in order to expose timing variation during verification.

Clepsydra is easily adoptable in the hardware design flow. It does not employ any additional HDL language features. And while it generates synthesizable logic that could be used for runtime detection, we envision its usage primarily during design time, when the Clepsydra logic is analyzed by EDA tools to verify the existence (or lack thereof) of timing-based properties. The Clepsydra logic is only used for analysis and is discarded before manufacturing; thus, it imposes no additional runtime overhead. We show how to use Clepsydra to detect timing leakage in various existing architectures or prove that they have constant execution time. The disclosed subject matter includes: Modeling timing-based information flows in hardware designs; Developing Clepsydra for automatic generation of digital logic for testing timing behavior of hardware designs; Analyzing timing-based security properties of various hardware architectures using Clepsydra.

In the disclosed subject matter, IFT-based techniques enable security analysis, where prior tools are inadequate for establishing formal guarantees of timing-based properties. The disclosed model for segregating different forms of logical flows can resolve this issue.

Security Properties

Isolation of different logical components is a security property that hardware designers seek to provide. Two major security properties can be enforced through isolation:

Confidentiality: Preventing untrusted parties from observing secret information by isolating the units which process secret data. For example, in a cryptographic hardware we want to ensure that the secret key does not leak to public outputs as a result of design flaws, hardware Trojans or side channel leakage.

Integrity: Preventing unauthorized parties from modifying sensitive information. For instance, the registers storing cryptographic keys should only be accessible by trusted sources.

In order to provide sound security guarantees, information flow may be analyzed through both data channels (also known as functional channels) and timing channels. The former ensures that data does not move among isolated components, while the latter certifies that the timing footprints of the isolated entities do not form a communication channel.

IFT & Hardware Security Verification

IFT techniques provide a systematic approach for verifying security properties related to integrity and confidentiality. This works by assigning security labels to different signals and tracking how these labels propagate through the system. Different security properties can be tested by defining the input labels and inspecting the output labels. Precision of an IFT technique, i.e. how closely the reported flows resemble the actual flows, is directly affected by the label propagation rules.

If the label propagation rules are not comprehensive enough to capture all forms of digital flows, the design might be inaccurately marked as secure. Information can flow in both explicit and implicit ways. In the explicit form, information flows to the output of an operation which is processing sensitive data. More subtly, data that controls conditional statements can implicitly affects the results. For instance, in the code if (c) then x=y+z; signal x is explicitly affected by signals y and z, and implicitly by signal c. For an IFT technique to be sound and free from false negatives, it should be capable of tracking both implicit and explicit flows.

Furthermore, label propagation rules should detect cases where flow of information is blocked. For example, if certain bits of the secret data is ANDed with zero, there will be no flow from those bits to the output of the AND gate. However, a conservative tracking rule, which assigns the highest security labels of the inputs to the output, marks all the output bits as sensitive. In contrast, a precise IFT tool, built upon stricter rules which take into account Boolean values of the operands and the operation functionality, can recognize absence of flows and avoid certain false positives.

Isolating Timing Flows

Existing IFT techniques track both functional flows and timing flows using the same set of labels and propagation rules. Thus, when a flow is detected, whether it is a functional flow or a timing flow, remains unknown. However, different applications necessitate different forms of isolation. For instance, both timing and functional isolation should be guaranteed when a cache is shared among mutually untrusting processes. But secure implementation of a cryptographic algorithm only requires elimination of timing channels as functional flows are protected by encryption. This property cannot be tested using IFT techniques which capture all forms of logical flows through a single set of labels. As the cipher is always affected by the secret key through functional flows, its security label will be raised to the security label of the key, independent of existence of timing flows. This significantly limits employment of IFT techniques for security analysis as similar scenarios happen in many applications where functional flows are inevitable but timing-based flows should be eliminated.

Since conventional IFT techniques are designed for tracking all forms of logical flows, employing them to detect only timing flows results in a considerable number of false positives. As timing flows are a subset of information flows; a set of stricter propagation rules can be designed that work on a separate set of labels and track only timing flows while ignoring functional ones. In the next section we introduce a set of rules for detecting only timing flows and tracking them through the system.

Modeling Timing Flows

Timing flows exist from inputs to outputs of a circuit if the time that is taken for the outputs to become available depends on the Boolean values of the inputs. These flows can be exploited if the input signals causing them contain secret information, and the completion time of the unit can be measured by an untrusted party. For instance, consider a division unit, as shown in FIG. 1, implemented via consecutive subtraction of the divisor from the dividend. The execution time of this algorithm depends on the input values as the number of subtractions is not fixed. This indicates that even if the Boolean value of the quotient is undisclosed, evaluating the execution time reveals information regarding the inputs. Timing variations may be represented in digital circuits, and a formal model may be developed for capturing them.

Characterizing Timing Flows

Completion time of a design is defined by the time when its output is updated to its final value. If no timing flow exists from input X to output Y, the time taken for Y to reach its final value should be constant as X changes. Thus, in order to detect timing flows, it should be determined whether or not the updates made to the outputs occur at constant timesteps. This can be addressed by detecting variations in the update time of all design variables and tracking them to the final outputs. This can be done for any arbitrary digital circuit by answering three questions: How are timing flows generated from a set of sensitive inputs? How does the flow propagate once generated? And lastly, what are the necessary conditions for blocking the flow of timing information and enforcing constant time execution? Since we are interested in detecting timing variations in terms of clock cycles, we need to analyze the design's registers and the signals which control them.

Generation of Timing Variation: A design's registers are written to by a set of data signals which are multiplexed by controllers at each cycle. Considering a register where none of its data or control signals has timing variation but might contain sensitive data, we want to figure out the circumstances under which timing variations occur at the register's output. If the register is definitely updated at each clock cycle, there will be no timing variations. However, if occurrence of updates are tentative, i.e. there is a degree of freedom for the register to hold its current value or get a new value, timing variation could occur. If the controller signal which is deciding the occurrence of the update is sensitive, the resulting timing variation will contain sensitive information as well.

Going back to the division example in FIG. 1, the updates made to the register temp_quotient are conditioned on the input. Thus, based on the Boolean values of the input signals, this register might get its final value at different times. In Theorems 1 and 2, detecting conditional updates caused by sensitive data soundly captures all timing flows while discarding functional-only ones.

Propagation and Blockage of Timing Variation: If any of the data or control signals of a register has cycle level variations, the variation can flow through the register. While simply propagating these flows soundly exposes all timing variations, it overestimates the flow when mitigation techniques are implemented to eliminate the variations. In other words, we need to be able to detect situations where timing variations are not observable at a register's output even though they are present at its input.

In division example in FIG. 1, instead of directly writing the temp_quotient to the output, a wait period is taken before updating the output value. If the wait period is longer than the worst-case execution time, the output gets its update at constant time steps. Theorem 3 shows that if there exists a non-sensitive control signal which fully controls the occurrence of updates to a register, it can block flow of timing variation from input to output of the register. Fully controlling control signal implies that the register gets a new value if and only if the controller gets a new value. Thus, the timing signature of the register output is identical to the control signal (with a single cycle delay) and is independent of its input. Implementing this policy reduces the number of false positives to some extent without imposing any false negative. In the division example, if the counter is large enough, the output value changes immediately after the done condition is updated and keeps its old value while done does not change. Hence, all the variations to the final output are controlled by the done signal which is non-sensitive, indicating constant execution time with respect to inputs.

IFT concepts are defined below and the earlier claims proven. We show that our model soundly discovers all potential timing channels by proving that detecting tentative updates of design's registers is adequate for exposing all timing variations, and the presence of non-sensitive fully controlling signals eliminates existing timing variations. Also proven is that the model ignores functional-only flows and thus is more precise for analyzing timing-based properties compared to IFT techniques which capture all logical flows.

Definition 1. An event e over data set Y and time values T is shown as the tuple $e=(y, t)$ for $y \in Y$ and $t \in T$, where y and t can be retrieved by functions val(e) and time(e). If y is an n-dimensional vector, and t the number of clock ticks that has past, the inputs or outputs of a design with n ports can be represented by event e.

Definition 2. Trace A(Y,n) represents n events $\{e_i\}_{i=1}^n$ over data set Y, which are ordered by time: time($e_i$)=time($e_{i+1}$)+1.

Definition 3. For any trace A(Y,n), its distinct trace d(A) is defined as the longest sub-trace of A, where consecutive events have different values, and for any two consecutive events in A such that val($e_i$)≠val($e_{i-1}$), $e_i$ is in d(A)

For example, for trace A={(10,1), (10,2), (20,3), (20,4)}, its distinct trace is d(A)={(10,1), (20,3)} since the values only change at clock cycle 1 and 3.

Definition 4. Traces A(X,k) and A'(x, k) are value preserving with respect to set I if the only difference between their corresponding events $e_i$ and $e'_i$ is in the j-th element of the value vector such that $j \in I$.

In IFT analysis, the effects of a set of sensitive variables by testing the design with respect to input traces which only differ in the sensitive inputs is of interest. This idea can be modeled by using value preserving traces where I is the set of sensitive inputs.

Definition 5. Output of an FSM F is completely controlled by input J if the FSM output is updated if and only if input J is updated.

Definition 6. For any set of wires W, sensitivity label set $W_s$ and timing label set $W_t$ indicate if W carries sensitive information or timing variation, respectively.

Definition 7. In a sequential circuit represented by the FSM F=(X, Y, S, $s_0$, δ, α), a functional-only flow from a set of sensitive inputs I exists if there exist two value preserving (with respect to I) input traces A(X,k) and A'(X, k) such that when fed to the FSM, the timesteps of the distinct traces of the outputs are equivalent, while the values of corresponding events varies. Stated formally: if B=α(A', $s_0$) and B'=α(A', $s_0$), then: $\forall e_i, e'_i \in d(B)$, d(B') time($e_i$)=time ($e'_i$) and $\exists e_j e'_j \in d$ (B') such that val($e_j$)≠val($e'_j$)

Definition 8. In a sequential circuit represented by the FSM F=(X, Y, S, $s_0$, δ, α) a timing flow from a set of sensitive inputs I exists if there exist two value preserving (with respect to I) input traces A(X,k) and A'hu (X, k) such that when fed to the FSM, the timestep of the distinct traces of the outputs are not equivalent. Stated formally, if B=α(A, $s_0$) and B'=α(A', $s_0$), then: $\exists e_j, e'_j \in d(B), \in d(B')$ such that time($e_j$)≠time ($e'_j$)

Definition 9. For a combinational logic function $f: X \to Y$ its flow tracking function $f_s: X \times X_s \to Y_s$ determines whether or not sensitive inputs affect the outputs. If $f(x_1, \ldots, x_n)=(y_1, \ldots, y_m)$ then $f_s(x_1, \ldots, x_{1s}, \ldots, x_{ns})=(y_{1s}, \ldots, y_{ms})$, where if set of sensitive inputs $\{x_j | x_{js}=1\}$ can affect value of $y_i$ then $y_{is}=1$ indicating information flow exists from the sensitive inputs to output $y_i$.

Definition 10. For a sequential logic function $f: X \times S \to Y$, where X, S, Y are the inputs, states, and the outputs, the time tracking function $f_t: X \times X_t \times X_s \times S \times S_s \times S_t \to Y_t$ determines if a set of inputs tainted with sensitive information or timing variation can affect timing variations of the output. If $f(x_1, x_2, \ldots, x_n, s_1, s_2, \ldots, s_l)=(y_1, y_2, \ldots, y_m)$ then $f_t(x_1, \ldots, x_n, x_{1s}, \ldots, x_{ns}, x_{1t}, \ldots, x_{nt}, s_1, \ldots, s_l, s_{1s}, \ldots, s_{ls}, s_{1t}, \ldots, s_{lt})=(y_{1t}, \ldots, y_{mt})$, where if a set of tainted inputs $\{x_j | x_{js} \lor x_{jt}=1\}$ can affect whether or not state $s_i$ is updated then $s_{it}=1$ and we say timing flow exists from the tainted inputs to output $s_i$.

Theorem 1. The time tracking logic $F_t$ of FSMF captures timing flows of the FSM Proof To prove this theorem we show that the existence of a timing flow reduces to variations in occurrence of updates to the output, and therefore is captured by $F_t$.

If a timing flow exists with respect to the set of tainted inputs I, based on Definition 8 there exist value preserving traces A(X, k), A'(X, k) such that: if B=α(A), d(B)=($e_1$, $e_2$, ..., $e_m$) and B'=α(A'), d(B')=($e'_1$, $e'_2$, ..., $e'_m$) then $\exists j \in [1:m]$ such that time($e_j$)≠time($e_j$)≠time($e'_j$).

Consider n to be the smallest index such that time($e_n$) ≠time($e'_n$). Without loss of generality we can assume that time($e_n$)=$t_n$ and time($e'_n$)=$t_n$+d, d>0. Basically, we are assuming n to be the time when the new value of trace B appears with delay d compared to trace B. We can write the elements of these two traces up to the nth element:

$$d(B)=(v_1,t_1),(v_2,t_2),\ldots,(v_{n-1},t_{n-1}),(v_n,t_n)$$

$$d(B')=(v'_1,t_1),(v'_2,t_2),\ldots,(v'_{n-1},t_{n-1}),(v'_n,t_n+d)$$

$$\forall i \in [2:n]: v_i \neq v_{i-1} \text{ and } v'_i \neq v'_{i-1} \qquad \text{Equations 5}$$

Based on Definition 3, the following observations can be made based on the above traces: (a): $(v_n, t_n)$ and $(v_{n-1}, t_{n-1}) \in B$ and (b): $(v'_{n-1}, t_n)$ and $(v'_{n-1}, t_n-1) \in B'$ From (a) we can infer that value of trace B is updated at time $t_n$ from $v_n-1$ to $v_n$ while equation (b) shows that value of trace B is not updated at time $t_n$ and is equal to $v'_{n-1}$.

By Definition 4, all input events remain the same $\forall i / \in I$, meaning that the only difference between them is the sensitive inputs. Thus, the difference in the update to the output is caused by the set of sensitive inputs and is captured by $F_t$ based on Definition 10.

Theorem 1 indicates that the tracking logic generated by clepsydra track all timing flows in the given design through the "t" label, hence it is sound.

Theorem 2. The time tracking logic $F_t$ of FSMF does not capture functional-only flows of the FSM Proof We prove this theorem by showing that the existence of functional only flows will not impose any variations on the occurrence of updates to the output, and thus will not be captured by $F_t$.

If a functional-only flow exists with respect to the set of sensitive inputs I, then based on Definition 7 there exists value preserving traces $A(X,k)$, $A'(X,k)$ such that: if $B=\alpha(A)$, $d(B)=(e_1, e_2, \ldots, e_m)$ and $B'=\alpha(A')$, $d(B')=(e'_1, e'_2, \ldots, e'_m)$ then (1) $\forall i \in [1:m]: \text{time}(e_i) = \text{time}(e'_i)$      Equation 7

$\exists j \in [1:m]:$ such that $\text{val}(e_j) \neq \text{val}(e'_j)$      Equation 8

We claim that there is no time tn such that the value of one of the traces is updated while the other one is not. Without loss of generality, we show that there is no time $t_n$ where the value of B is updated but the value of B remains the same. We prove this via proof by contradiction.

Theorem 2 indicates that the tracking logic generated by clepsydra tracks timing flows through label "t" which does not contain functional-only flows. Thus, it generates fewer false positives for tracking timing flows compared to RTLIFT, GLIFT and other IFT techniques which track information flow in a single channel.

Contradiction hypothesis: At time tn, trace B is updated while trace B holds its value. Let $v_n$ and $v_n-1$ be the values of trace B at times $t_n$ and $t_n-1$ respectively. Based on the contradiction hypothesis, $(v_n,t_n)$ is an event in B. Hence, d(B) contains an event $e_i$ such that $\text{time}(e_i)=t_n$. Let us assume that $e_i$ is the ith element of d(B). Similarly, assume values of trace B in times $t_n$ and $t_n-1$ are $v_n$ and $v_n-1$. Based on the contradiction hypothesis we know $(v'_n, t_n)$ is not an event in d(B) since B is not updated at this time. Thus, d(B') does not have any event $e'_j$ which timestep is $t_n$. Hence, if we pick the ith element of d(B'), called $e'_i$, then $\text{time}(e'_i) \neq t_n$. So: $\exists i$ in $[1:m]$ such that $\text{time}(e_i) \neq \text{time}(e'_i)$ This is contradictory to the definition of functional-only flows since there could be no time $t_n$ where the values of one of the traces is updated while the other one is not. Based on Definition 10 this is not captured by $FSM_t$.

Theorem 3. If FSMF is completely controlled by input J such that $J / \in I$, then no timing variation is observable at the output of FSM F as a result of processing traces which are value preserving with respect to set I.

Proof We will prove this theorem via proof by contradiction.

Contradiction hypothesis: there exist value preserving (with respect to I) traces $A(X, k)$ and $A'(X, k)$ which impose timing flow at the output of FSM F which is completely controlled by input $J/\in I$. Based on Definition 8:

let $B=\alpha(A,s_0)$, and $d(B)=\{e_1,e_2, \ldots, e_m\}$     Equation 9 let $B'=\alpha(A',s_0)$, and $d(B')=\{e'_1,e'_2, \ldots, e'_m\}$     Equation 10

$\exists i \in [1,m]$ such that $\text{time}(e_i) \neq \text{time}(e'_i)$     Equation 11

Let n be the smallest index in the above equation such that $\text{time}(e_i) \neq \text{time}(e'_i)$. Without loss of generality we can assume $\text{time}(e_i)=t_n$ and $\text{time}(e'_i) \times t_n \div d$. We can write elements of $d(B)$ and $d(B')$ up to the nth element:

$d(B)=(v_1,t_1),(v_2,t_2), \ldots, (v_{n-1},t_{n-1}),(v_n,t_n)$ $d(B')=(v'_1,t_1),(v'_2,t_2), \ldots, (v'_{n-1},t_{n-1}),(v'_n t_n+d)$    Equations 12

Using Definition 3, we make the following observations:

(a): $(v_n,t_n)$ and $(v_n-1,t_n-1) \in B$     Equation 13

(b): $(v'_{n-1},t_n)$ and $(v'_{n-1},t_n-1) \in B'$     Equation 14

The above equations specify that trace B has been updated at time $t_n$ while B is not updated. Let's denote the sub-trace of the fully controlling input J from traces A A' and with j and j', respectively. Based on Definition 5, equation (a) indicates that input j is updated at time $t_n$, and from (b) we know input j is not updated at this time. This is a contradiction as the only difference between input traces A and A are with respect to set I, and since $J/\in I$ then j and j should be identical.

Theorem 3 indicates that if there exists a set of untainted variables which completely control updates to an output, then there is no timing flow at the output. This enables further reducing the false positives in tracking timing flows. Timing variation description: in the given code, there are two conditional code blocks. In the first one, if(!done) while(dividend >divisor) the variable "temp_quotient" is updated. This indicates timing variation at "temp_quotient" from values of dividend/divisor. However, "temp_quotient" is not directly written to the output "out" as it is guarded by "if (counter=0)". Here, value of counter completely controls whether or not "out" is updated. Hence, based on theorem 3, there is no timing variation at "out" even though there is timing variation at ""temp_quotient".

Clepsydra Implementation

As shown in FIG. 2, the input to Clepsydra is a hardware design described by its abstract syntax tree (AST) which is obtained by parsing its HDL representation. As output, Clepsydra generates a synthesizable Verilog code which has all the functionalities specified in the original design, alongside the complementary logic for propagating both timing based and generic information flows from design inputs to its outputs. The tracking logic is realized in two steps: 1) extending each variable in the design with labels sensitivity level and timing level which indicate if the variable carries sensitive information or timing variation, respectively; and 2) inserting logic for updating these labels as their corresponding variables change. The code generated by Clepsydra is then given to EDA tools for security analysis. Security properties are assessed by specifying labels of the input variables and observing the output labels after simulation, formal verification or emulation. If the output labels comply with the designers' intention, the tracking logic is discarded and the original design can be used for fabrication. In case of violating the security properties, the original design should be modified, fed to Clepsydra, and retested.

Clepsydra enables analyzing timing behavior of a design with respect to any arbitrary subset of its inputs which are marked as sensitive. This facilitates modeling a variety of security properties. For example, constant time execution can be tested by marking all the inputs as sensitive. But in many scenarios we are only interested in constant execution time with respect to certain inputs. For instance, when a cache is shared between mutually untrusting processes, timing variations caused by accesses from sensitive data is exploitable. However, variations due to cache conflicts on non-sensitive data are not valuable to the adversary. indiscriminately eliminating all timing variations results in disabling the cache as a whole. Moreover, many mitigation techniques are based on randomizing timing variations. To differentiate benign variations from sensitive ones, we should inspect the source of the variations. This is done by tracking sensitive data throughout the circuit, and extracting the sensitive timing variations from them.

Tracking Sensitive Information

Sensitive information affects computation result through both the data path and the control path, creating explicit and implicit flows. To Input: Verilog code AST file Output: IFT-enhanced Verilog code detect explicit flows, Clepsydra replaces each data path operation with an IFT-enhanced version of it which is available as a Verilog module in a predesigned IFT library (lines 11-13 of Algorithm 1). Each IFT enhanced operation receives the original inputs of the operation along with their sensitivity labels, and computes the outputs of the operation as well as their sensitivity labels. A simple example of replacing an add operation with an IFT-enhanced module is shown in the first line of FIG. 3. Various complexity-precision trade-offs for the tracking logic can be explored by modifying the label propagation rules of the IFT-enhanced modules.

---

Algorithm 1: Tracking logic generation

---

Preprocessing:
1  for each register r do
2   n: number of the paths to r;
3   m: number of the controllers of r;
4   if then r bal=0;
5     n=2$^m$
6   lse r bal=1; end
7   for each conditional assignment a do
8    traverse CFG;
9    a con = list of controllers; end
Logic insertion:
10 for each variable x[n : 0] do
11  define x _s[n : 0], x _t[n : 0]; end for each DFG operation a = b op c; do
12  instantiate IFT-enhanced operation:
13   op IFT (a, a _s, b, b s, c, c s);
14  insert time tracking logic:
15   a t = b t | c t; end
16  for each controller c do
17   insert buffer c buf <= c; end
18  for each conditional assignment A <= B do
19   insert implicit IFT logic:
20   A s <= B s |c s; ∀c ∈A con.
21   A t <= (B s & !A-bal);
22   | (B t & !(c is non-sensitive and fully controlling); end

---

To track whether or not an assignment is implicitly affected by sensitive data, we need to figure out if its execution depends on any sensitive variable. To do so, Clepsydra extracts the design's control flow graph from its AST representation, and constructs a list of control signals for each conditional assignment (lines 68 of Algorithm 1). Next, based on the variables in the list and their sensitivity labels the logic for tracking the implicit flow is generated and added to the explicit flow tracking logic (lines 18-20 of Algorithm 1).

Tracking Timing Flows

Clepsydra inserts logic components at each register interface to detect if any timing variation is generated from sensitive data, and whether or not existing variations from the register input flow to the register's output (lines 21-22 of Algorithm 1). As we proved earlier, the necessary condition for formation of timing variation is existence of a register which update depends on sensitive values. To identify these cases, we need to determine if a register has the flexibility of selecting between getting a new value and holding its current value. To examine this property for each register in the design, Clepsydra statically enumerates all the paths in which the register is written to and compares it with the total number of paths that the controllers of that register can theoretically activate. If these two numbers are unequal, a bit which indicates the updates to the register are tentative is set (lines 1-5 of Algorithm 1). Such analysis on a Verilog code is relatively easy compared to software languages since multiple writes to a register are modeled as a single multiplexer with n data inputs and m control inputs. Tentative update scenarios happen if which indicates that the multiplexer has direct feedback from its output to its own input. To illustrate this idea, consider the Verilog code written in FIG. 6A and the IFT-enhanced Verilog code generated by Clepsydra in FIG. 6B. Highlighted parts in lines 9 and 20 show the logic responsible for detecting generation of timing flows. Values of A_bal and Y_bal are statically decided by Clepsydra after analyzing the branches in the original code. An XNOR function is also added to detect cases where the register gets its value from a different variable without actually getting updated. Even though such scenarios are rare in actual designs, the logic for detecting them is added to ensure capturing cases where tentative updates are disguised by renaming the variables.

Once generated, timing variations flow directly through the subsequent registers unless special mechanism for eliminating the variations is implemented. Register X in FIGS. 3A-3C directly gets its value from register A, thus if any timing variation is present as the output of A, it will unconditionally flow to X. As shown in the second line of the necessary condition for formation of timing variation is existence of a register which update depends on sensitive values. To identify these cases, we need to determine if a register has the flexibility of selecting between getting a new value and holding its current value. To examine this property for each register in the design, Clepsydra statically enumerates all the paths in which the register is written to, and compares it with the total number of paths that the controllers of that register can theoretically activate. If these two numbers are unequal, a bit which indicates the updates to the register are tentative is set (lines 1-5 of Algorithm 1). Such analysis on a Verilog code is relatively easy compared to software languages since multiple writes to a register are modeled as a single multiplexer with n data inputs and m control inputs. Tentative update scenarios happen if n≠2$^m$ which indicates that the multiplexer has direct feedback from its output to its own input. To illustrate this idea, consider the Verilog code written in FIG. 6A and the IFT-enhanced Verilog code generated by Clepsydra in FIG. 6B. Highlighted parts in lines 9 and 20 show the logic responsible for detecting generation of timing flows. Values of A_bal and Y_bal are statically decided by Clepsydra after analyzing the branches in the original code. An XNOR function is also added to detect cases where the register gets its value from a different variable without actually getting updated. Even though such scenarios are rare in actual designs, the logic for detecting them is added to ensure capturing cases where tentative updates are disguised by renaming the variables.

Once generated, timing variations flow directly through the subsequent registers unless special mechanism for eliminating the variations is implemented. Register X in FIGS. 3A-3C directly gets its value from register A, thus if any timing variation is present as the output of A, it will unconditionally flow to X. As shown in the second line of FIG. 3B, timing variation directly flows through combinational logic since we are interested in cycle level precision. As we proved in the previous section if there exist any non-sensitive control signal which fully controls the updates to the register, it can block flow of timing information. To detect existence of fully controlling signals for conditional assignments to registers, Clepsydra inserts XOR gates for comparing occurrence of updates. This logic is shown in lines 11 and 22 of FIG. 6B. The XOR function indicates that updates of the output register and its controller are synchronous. And the inverters specify that the controller does not have any sensitive information. This logic is responsible for preventing overestimating the flow to some extent as depicted by the AND function. The logic behind Y_up, A_up, B_up and done up are not shown in the figure for simplicity, but they are computed by XORing the current state with the next state. Since, the updates to the control signals are observable at the register output with one cycle delay, Clepsydra inserts buffers to store control values from the previous cycle in order to compute whether or not they have been updated in the previous cycle (lines 16-17 of Algorithm 1).

Detailed below are how various security properties are specified based on notion of IFT and verified on Clepsydra logic. FIG. 7 lists the hardware designs we tested along with the assessed security properties. For each design, we briefly discuss the architectural features which create timing channels, the attack model for exploiting them, the existing mitigation techniques, and the results of our security analysis. For all of the experiments, we obtained the AST representation of plain Verilog code by parsing it using Yosis tool and employed Clepsydra to generate tracking logic. On the IFT-enhanced code generated by Clepsydra, effect of input X on timing behaviour of output Y can be inspected by setting the input signal X_s as high and observing the value of the output Y_t after simulation or formal verification.

Arithmetic Modules

For the first set of experiments, we sought proving constant time properties of arithmetic units, as variation in completion time of these units can be exploited to extract information regarding the input. A fixed-point math library was tested (e.g., Opencores website), which is supposed to run in constant time as claimed by its designers. In order to verify this claim, data inputs of each unit can be marked as sensitive and observed the timing labels of the outputs.

The multiplication unit is based on accumulating partial products at each cycle. Thus, if the MSB bits of the multiplier are zero the result will be available faster since the partial products in the last cycles are zero. The output ready signal of the design is set after a counter reaches zero. After analyzing this design, we noticed that while the ready output is free from timing variations, the product result is not. This indicates that the result could potentially become available before the ready signal is raised. In order to eliminate this flow, we modified the design by adding a register which blocks the working result to write to the final output before the counter resets. After this modification, we could formally prove that the design runs in constant time using Questa Formal Verification tool. The division unit, similar to the example we had throughout the paper, is implemented by subsequently subtracting the divisor from the dividend. Similar to the multiplication unit, a wait state is responsible for enforcing constant time updates at the final outputs. This time no timing variation was detected by our analysis as all the output variables, including the result itself, are controlled by the wait state.

This set of experiments showed that our model is capable of isolating different forms of flows and proving absence of timing flows while functional flows exist. Furthermore, it shows that the generated tracking logic is precise enough to detect cases where timing variations are eliminated by delaying all the updates as long as the worst-case scenario.

Cache Implementations

Cache-based side channel attacks have been repeatedly employed to break software implementations of ciphers such as RSA and AES. These attacks target implementations which use pre-computed values that are stored in the cache and accessed based on the value of the secret key. Thus, an attacker who is capable of extracting the cache access pattern of the process running the encryption can deduce information regarding the key. Percival has shown that an adversarial process sharing the cache with the OpenSSL implementation of the RSA cipher can retrieve cache access pattern of the victim process by inducing collisions in the cache. By remotely attacking AES implementation of the OpenSSL protocol, Bernstein showed that timing channels can be exploited even when the cache is not shared with an untrusted process. In his attack, Bernstein exploited the cache collisions between different requests by the victim process itself to reveal the encryption key. While these attacks vary substantially in terms of implementation, they all exploit the timing variations from the cache collisions. Several cache designs have been proposed to bar index value of sensitive accesses to affect the time that it takes for the cache to retrieve data in later cycles. We have used Clepsydra to inspect timing flows in an unsecure cache and two secure architectures, PLcache and RPcache. To model timing leakage via external interference, we consider two processes with isolated address spaces sharing the same cache. Marking indexes of accesses made by one process as sensitive, we want to figure out if the data read by the other process contain timing variation.

The internal interference scenario is modeled with a single process and inspecting if marking certain indexes as sensitive causes timing variation when the same lines are read with different tags.

PLcache eliminates leakage channel by letting processes to lock their data in the cache and disabling their eviction. Since sensitive data can no longer be evicted, it cannot affect the timing signature of the system. We implemented the PLcache and acquired its IFTenhanced tracking logic from Clepsydra to test if this partitioning scheme eliminates the flow. Based on our analysis, if data with sensitive indexes is preloaded to the cache and locked, there will be no information leakage as the result of later accesses to the locked lines. However, this result is based on assuming that the preloading stage is not sensitive itself.

The RPcache was tested which randomly permutes the mapping of memory to cache addresses to eliminate any exploitable relation between the collisions. When external interference between untrusting processes are detected, PRcache randomly chooses a cache line for eviction. Thus, the attacker cannot evict the victim's process sensitive information and observe whether or not that causes delay later on. In case of internal interference, collisions are handled by directly sending the data from the colliding access to the processor and randomly evicting another line. Our analysis showed that RPcache eliminates timing variations assuming that the inputs to the random number generator are not sensitive.

Bus Architectures

Another source of timing channel in hardware designs arises when different units are connected over a shared bus. In such scenarios, cores that are supposed to be isolated can covertly communicate by modulating the access patterns to a shared resource and affecting the time when other cores can use the same resource. Using Clepsydra, we have inspected presence of timing flows when WISHBONE interconnect architecture is used to arbiter accesses on an SoC. To access a shared resource over WISHBONE, the master core sends a request signal, and waits for the arbiter to send back an ack signal. Timing channel between different cores can be assessed by marking the request signal sent by one core as sensitive and observing the timing label of the ack signal sent to the other core in later requests. We have tested this scenario for the original WISHBONE arbiter and two modified versions of it.

The original WISHBONE arbiter, implemented by the Opencores community, is based on a round robin algorithm. Our experiments revealed existence of timing channel between the cores connected over this architecture as the grant given to one core depends on the former requests sent to the arbiter. In order to eliminate the channel, we replaced the round robin arbiter with a TDMA scheme and retested the design. In this case, no timing channel is detected as the grants are given based on a counter. In order to improve the efficiency of the arbiter, we tested a more flexible scenario where the cores are divided into two different groups. The cores within the same group are arbitrated based on a round robin algorithm, while the two groups are time multiplexed. This time our experiments showed that the two groups are isolated from each other while timing channel exists between elements of the same group.

Crypto Cores

Timing variations in hardware implementations of RSA and AES ciphers were tested. Since the ciphertext is computed from the key, functional flow from the key to the cipher is inevitable. Thus, existing IFT tools cannot be leveraged to inspect existence of timing channels which are not intended by the designer. Here, we have tested existence of timing channel in two ciphers from the Trusthub benchmarks. We have assessed timing flow from the secret key to the ciphertext by marking the key bits as sensitive and observing the timing label of the output. Using Questa Formal Verification tool we could prove that the AES core runs in constant time. However, for the RSA core, timing flow was detected from the secret key to the cipher as a result of insecure implementation of the modular exponentiation step. We have left comparing timing leakage of different RSA architectures and the effectiveness of the proposed mitigation techniques as our future work.

As stated earlier, the mentioned IFT tools track logical information flows through a single channel and leave the nature of the detected flows as unspecified. Disclosed herein is a method for tracking timing flows and generic information flows in two separate channels in order to enable analysis of a wider range of security A model for tracking timing-based information flows in hardware designs is disclosed. Clepsydra, an IFT tool is disclosed which automatically generates tracking logic based on the proposed model. Clepsydra facilitates hardware security verification by enhancing plain HDL codes with synthesizable logic on which variety of security properties can be tested using conventional EDA tools. In our experiments, we leveraged Clepsydra to detect timing channels in different architectures and prove absence of timing leakage when mitigation techniques such as randomization, partitioning or delaying till the worst case execution are implemented.

Today's computing technology remains vulnerable to classic exploit techniques due to the fact that many fundamental computational models and traditional design flows do not consider or prioritize security. In the realm of hardware, security is rarely considered during design space exploration. Security vulnerabilities can originate from design flaws, which can be fully eliminated after a complete verification. Unfortunately, this is impractical due to the scale of modern chips. Furthermore, novel attack vectors like side-channel analysis undermine classic assumptions about the accessibility of internal secret information outside of a computing system. In addition, hardware designs often required incorporating third party IP cores, which may contain undocumented malicious design modifications known as backdoor.

Remedying these security vulnerabilities may be accomplished with a systemic solution. One such solution that has shown promise is information flow tracking (IFT). IFT models how labeled data moves through a system. It provides an approach for verifying that systems adhere to security policies, either by static verification during the design phase or dynamical checking at runtime. Recent work has demonstrated the effectiveness of hardware IFT in identifying and mitigating hardware security vulnerabilities, such as timing channels in cryptographic cores and caches, unintended interference between IP components of different trust, and information leakage through hardware Trojans.

Hardware IFT techniques have been deployed at different levels of abstraction. At the gate level, all logical information flows can be tracked by augmenting each logic primitive in the synthesized design netlist with additional IFT logic. While this simplifies IFT logic generation by breaking down complex language structures to lower level logic constructs, this method does not scale with design size since it relies on gate level verification. Language level methods avoid this problem by generating IFT logic at a higher level of abstraction. Previous language level IFT techniques are accomplished via designing type enforced HDL (Hardware Description Language). These techniques require that designs be rewritten or annotated in a new language in order to verify security properties, which can be a challenging task for hardware designers.

The level of abstraction can also affect the precision of the IFT logic. More specifically, the precision of IFT logic is determined by both the precision of the label propagation rules for logic operations and the granularity of the building blocks over which IFT is deployed. Gate level IFT methods achieve increased precision by defining precise tracking rules for a set of universal gates. On the other hand, gate level methods apply IFT at a fine granularity, and thus cannot detect higher-level dependencies (e.g., variable correlation due to reconvergent fanout) between the signals in the design.

A Register Transfer Level IFT (RTLIFT) method may allow an understanding of all logical information flows through RTL code. By defining precise label propagation rules for RTL expressions, we show that our method can achieve a higher level of precision as compared to gate level methods. Our IFT model is completely described with standard RTL syntax and thus eliminates the need for acquiring a new type-enforced language. Furthermore, we discuss how RTLIFT allows for separation of implicit and explicit flows, enabling various tradeoff of IFT precision, which cannot be realized using existing IFT methods. Disclosed herein are methods for precisely understanding all logical information flows through RTL design; techniques that allow trading-off IFT precision and security verification performance; experimental results that show the improvement in IFT precision and security verification time.

Gate level information flow tracking (GLIFT) performs IFT analysis directly on the "original" hardware design. It does this by creating a separate GLIFT analysis logic that is derived from the original logic but operates independently from it. GLIFT tracks any arbitrary set of flows by labeling different hardware variables as "tainted" and tracking their effect throughout the design. The GLIFT logic is generated once, independent of the security property, and can be used to verify any IFT property. GLIFT is primarily used at design time for testing and verification.

VeriCoq-IFT converts designs from a HDL representation to the Coq language, eliminating the need to redesign the hardware. However, a user may annotate the generated Coq code in order to analyze security properties. Furthermore, in all these three methods the flow of information may be tracked conservatively since the label propagation rules are defined as updating label of the output of any operation to the highest label of its inputs. This approach may overestimate the flow of information by ignoring the functionality of the operation and the exact values of the operands.

SecVerilog extends the Verilog language with an expressive type system. SecVerilog users may be required to explicitly add a security label to each variable in the code. These labels are a consequence of the security property that to verify the design. It uses a type system to ensure that the specified information flow policy is upheld. SecVerilog uses predicate analysis in order to acquire the hardware state essential for precise flow tracking. This complicates the labeling processing, and inevitably the intricacy of precise predicate analysis leads to loss of precision compared to simulation-based and dynamic approaches. Furthermore, the designer must specify many of the flow rules when adding labels to the variables. Ideally, this process would be automated, e.g., as done with GLIFT, otherwise it impedes its use as a hardware security design tool. Often there are many (potentially hundreds or thousands) of IFT properties that one wishes to test or verify on a single design. This may require the user to relabel the design in order to prove each different property. For example, in a cryptographic core proving that the secret key value does not affect the timing of the output signals requires a different labeling from proving that no inputs except the key and the plain text can affect the value of the cipher text.

RTLIFT creates a new methodology that combines the benefits of these previous approaches while eliminating drawbacks. RTLIFT works directly with existing HDL languages, and thus does not require a designer to learn a new hardware security language. Much like GLIFT, it automatically defines flow relation properties. Yet working at a higher level of abstraction leads to many benefits including faster verification time and more flexibility in defining different types of flow relationships (e.g., implicit versus explicit).

IFT Basics

Information flows from signal X to signal Y if and only if a change in the value of X can influence the value of Y. Information flow can model security properties related to both confidentiality and integrity:

Confidentiality: For example, assume that X is a secret value while Y is publicly observable. In this case, an attacker can extract sensitive information by observing and analyzing the variations in signal Y. For example, Y could be the "ready" output of a cryptographic core which in a secure design should not depend on the value of the private key stored in X; otherwise there is a timing side channel which can be used to extract the secret key. In this case, we want to insure the property that X does not flow to Y.

Integrity: For example, assume that X is an untrusted value while Y is trusted. In this scenario, we wish to ensure that an attacker cannot gain unauthorized access through Y by modifying the value of X For example, X may be an openly accessible memory location and we wish to ensure that it cannot be used to influence the results of a system control register. Thus, we want to insure again that X cannot flow to Y.

Hardware information flow tracking generally works by adding a security label to each signal and using that to track the influence of flow (or taint) of a set of signals throughout the circuit. The initial taint is set based upon the desired security property, and IFT techniques are used to test or verify whether that taint can move to an unwanted part of the system as specified by the security property.

IFT can be done with various levels of precision. One approach marks the output of each operation as tainted when any of its inputs is tainted. While simple, this method is overly conservative and can inaccurately report existence of flow in certain cases (i.e., false positives). This inaccuracy is due to the fact that based on the functionality of the operation, a single untainted input can dominate the output, yielding an untainted output while other inputs are tainted. To avoid this imprecision, the tracking rules need to take into account both the type of the operation and the exact state of the hardware.

To clarify this idea, consider the expression out=secret & 0x0F, where sensitive information is stored in an 8-bit variable secret and we want to determine if the information from secret flows to the variable out. The most conservative and least precise approach would mark all bits of out as tainted since secret is tainted. A more precise strategy gives us slightly different answer: the secret information only flows to the four least significant bits of out, and the other bits should not be marked as tainted since their values are zero regardless of the value of secret. To achieve this level of precision, separate tracking rules for different operations shall be defined as we discuss in Section IV-A.

IFT Precision-Complexity Trade-Offs

Tracking rules impose more complexity, and hence it might be desirable to deliberately add some false positives to the IFT logic by taking a rather conservative approach. In large designs it might be beneficial to use imprecise and efficient approaches to track the flow through complex arithmetic operations, while preserving the precision for logical operations such as AND, OR, XOR, etc. As opposed to the gate level where the difference between logical and arithmetic operations is lost, considering the high-level description of the design, one can define the tracking rules for various operations with different levels of precision and more flexibility.

The notion of taking various levels of precision based on the functionality becomes more important when extended to the different information flow paths in the design: the data flow and the control flow. The data flow represents how the information explicitly flows, while the control flow shows all the paths that might be traversed and hence contains information regarding the implicit flow. For example, in a conditional statement the flow from the right-hand side expression to the left-hand side variable is explicit and the logic implementing it is within the data path. However, the value of the left-hand side variable is also implicitly affected by the conditional variable which is represented in the control path. Implicit and explicit flows are not distinguishable in the gate level netlist. However, we can differentiate between them at the language level. We exploit this idea in order to adjust the complexity of the tracking logic based on the verification objective. Specifically, when searching for timing flows, which are caused by implicit flow, keeping the tracking logic associated with the data path imprecise, —hence reducing the logic complexity—and implementing the control flow's tracking logic precisely, we can realize a smaller tracking logic which does not impose additional false positives for tracking the implicit flow.

IFT Precision

In this section we discuss how generating the IFT logic at a higher level of abstraction can improve its precision level. Gate level IFT techniques necessitate synthesizing the design to its gate level netlist before generating the IFT logic. Resource sharing done by the synthesis tool introduces reconvergent paths to the netlist which are not present at the language level. Reconvergent paths lead to false positives in the tracking logic since the tracking rules cannot easily take into account the exact relationship between multiple inputs of an operation. To clarify the source of such imprecision, we deliberate the gate level and high-level tracking rules for a 2:1 multiplexer.

Figure 9C:
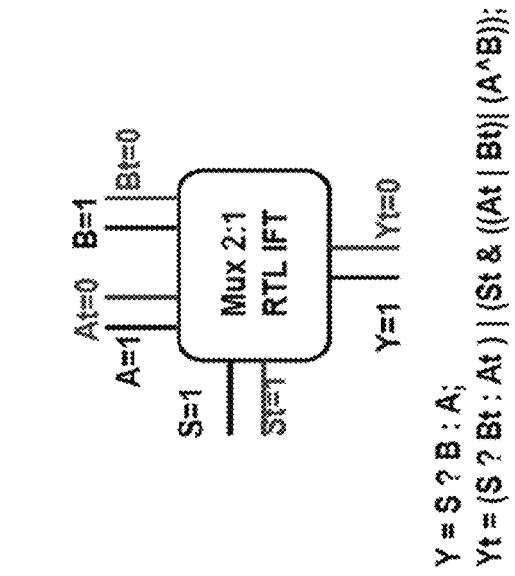
FIG. 9C depicts an example of IFT tracking logic for a 2:1 mux.
Figure 9B:
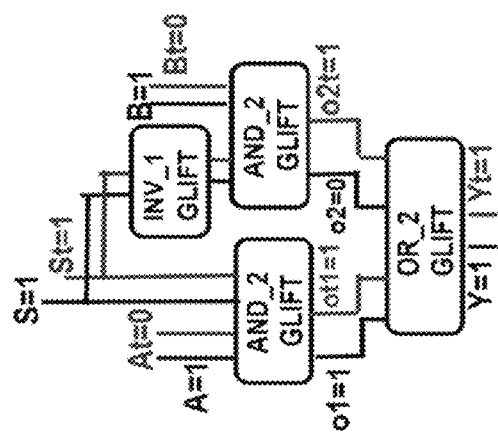
FIG. 9B depicts an example of IFT logic generated using gate level information flow tracking (GLIFT).
Figure 9A:
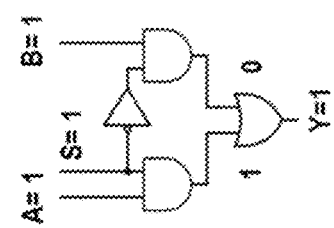
FIG. 9A depicts an example of a gate level structure of a mux.

FIGS. 9A-9C show an example illustrating how RTLIFT reduces false positives compared to GLIFT. FIG. 9C shows a multiplexer with data inputs "A" and "B", control input "S", and output "Y" implementing the following functionality "Y=S?A:B". FIGS. 9A and 9B show the Karnaugh map and gate level implementation of the multiplexer, respectively. Here we are interested to know if there is flow of information from variable "S" to output "Y" if all inputs have Boolean values one (i.e., A=1, B=1, S=1). GLIFT marks the output label "Y_t" as tainted because the output of both AND gates in FIG. 9A are tainted. This result in false positive as the output actually does not contain any tainted information because the output "Y" has Boolean value one independent of value of the "S" signal since "X" and "Y" are both equal. This false positive happens due to reconvergence paths which are not taken into account by GLIFT.

Figure 9D:
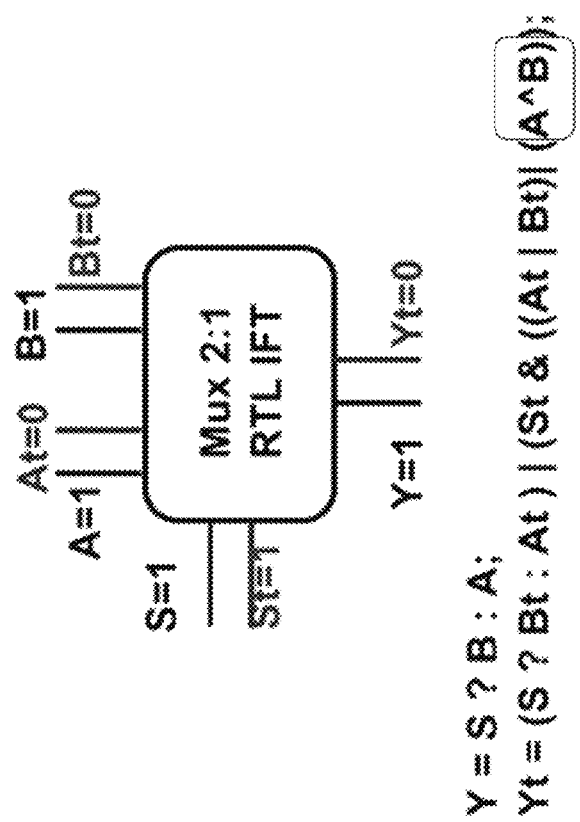
FIG. 9D depicts an example illustrating how RTLIFT reduces false positives compared to GLIFT.

FIG. 9D depicts an example illustrating how RTLIFT reduces false positives compared to GLIFT. For the multiplexer example described in FIG. 9C, RTLIFT correctly marks the output as non-tainted because the precise tracking logic at the RTL takes into account the higher-level dependencies between different variables.

FIG. 9A shows the gate level structure of a multiplexer and FIG. 9B represents its precise gate level tracking logic. Even though the flow is precisely tracked through each single gate, when combined together the multiplexer's IFT logic contains false positives. To examine when a false positive happens, we analyze the case where both data inputs A and B are one, and their security labels At and Bt are zero, indicating being untainted. The control signal S and its security label St are both equal to one, indicating being tainted. Analyzing the gate level tracking logic, the output of both AND gates have high security labels while only one of them is on. Consequently, both inputs to the OR gate are tainted resulting in a tainted output. Conceptually, the output of the OR gate is marked as tainted because flipping the value of its high input will change its result to zero. However, the missing part is that this flip cannot happen unaccompanied by a flip on the other input, which forces the final output to remain the same. This imprecision, in the presence of precise tracking logic for all the gates, occurs due to the reconvergence path at the input of the OR gate. The false positives provoked by the reconvergence paths at the gate level can be avoided by generating the tracking logic at a higher level as we can see in FIG. 9C.

Reconvergence paths also exist at the language level, which inevitably results in false positives. Precise tracking rules can be defined for gates or language constructs; however, this precision is based on the independency of the inputs. By generating the tracking logic at a higher level of abstraction and hence utilizing higher level tracking rules, we can overcome the dependency between the intermediate variables which improves the precision level. Fundamentally, precise information flow tracking is an undecidable problem as shown by Denning and Denning. Nonetheless, we improve IFT precision level in two ways: First, we have precise tracking rules specifically defined for each operation which take into account the exact state of hardware; second, we avoid a large class of false positives caused by the reconvergent paths in the gate level netlist by analyzing the design from a higher level of abstraction.

EXAMPLE IMPLEMENTATIONS

Figure 10:
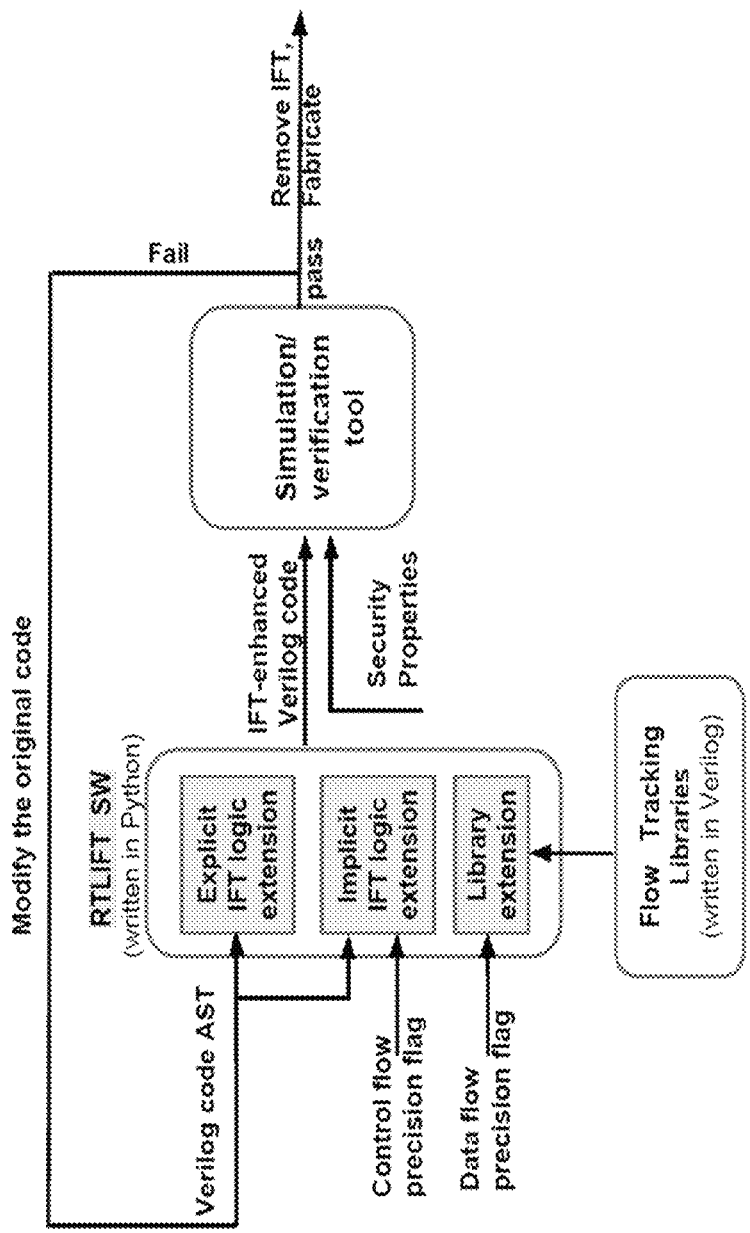
FIG. 10 depicts an example of a register transfer level information flow tracking (RTLIFT) overview.

RTLIFT software receives a synthesizable Verilog code along with flags specifying the precision level of the data flow IFT logic and the control flow IFT logic and generates functionally equivalent Verilog code instrumented with information flow tracking logic. Since the generated code is synthesizable, it can be analyzed by standard EDA test and verification tools allowing us to leverage decades of research on functional testing to assess security properties of hardware designs. If the IFT-enhaced design passes the security properties, the original code can be used for fabrication. Otherwise, the original code should be modified and analyzed again. FIG. 10 gives an overview of how the tool is used. RTLIFT is realized through the following steps: Designing flow tracking libraries; enhancing the combinational circuit with tracking logic; enhancing the conditional statements with logic that may be required for tracking the implicit flow. Each of these steps is detailed below.

FIG. 10 depicts an overview of how RTLIFT is used. RTLIFT software receives as input a set of security properties, the AST representation of Verilog code along with flags which specify precision level of tracking rules for the control flow and the data flow. RTLIFT also uses the predefined flow tracking libraries as described by FIG. 25. It enhances the input design with tracking logic for explicit flows, tracking logic for implicit flows, and tracking libraries, and writes it back in Verilog language. This enhanced design along with the security properties are given to a simulation/verification tool which analyzes the design against the properties. If the verification process passes, the IFT instrumentation is removed and the design is ready to be used in later design stages. If failed, the designer need to modify the code and re-run the verification.

Flow Tracking Libraries

For tracking the flow of information through an RTL code, each operation should be instrumented so it can operate both on the Boolean values and security labels of the operands. Hence, for each operation OP such that Z=X OP Y is a valid statement in Verilog, we have defined a module OP_IFT which receives inputs X and Y along with their security labels X_t and Y_t, and generates the output Z along with its security label Z_t. These modules are predefined and given to the RTLIFT software as an input file called "flow tracking libraries", as shown in FIG. 10. These libraries serve two goals: first, improving IFT precision by enabling operation-specific label propagation as opposed to the tracking rules in Caisson, Sapper and VeriCoq-IFT; second, automating the computation of security labels in contrast to the approach taken in SecVerilog.

We have defined two different sets of libraries, each of which calculating Z_t output with a different level of precision. In the conservative library, the label propagation rules overestimate the existence of flow by marking the output of each operation as tainted when any of its inputs are tainted, yielding a small tracking logic modeled with an OR expression. In the precise library, the label propagation rules are designed to minimize the number of false positives through each operation in exchange for a more complex tracking logic. The user selects which library should be used by specifying the precision flag for the data path logic. Other libraries with various precision-complexity balances can be added if required. FIGS. 11A and 11B show the IFT-enhanced modules for the AND operation available in the conservative and precise libraries respectively. In Section V we explain the design of IFT-enhanced modules for arithmetic operations in more detail.

FIGS. 11A-B show conservative and precise flow tracking logic for the AND operand in Verilog. The tracking modules receives Boolean inputs "X" and "Y" along with taint labels "X_t" and "Y_t" and generate the Boolean output "Z" similar to the initial AND gate along with its security label "Z_t". The two models only differ in how "Z_t" is computed. In the conservative model, the output is tainted when either of the inputs are tainted. In the precise mode, the output is tainted when one input is tainted when the other one has Boolean value one, or when both inputs are tainted.

Tracking Explicit Flows

Flow tracking starts by extending each bit of data, i.e., wires and registers in a given Verilog code, with a label that carries out information regarding the security properties of the data (Lines 1-3 in FIG. 13A). Here, a single bit label is analyzed, where a high value indicates either secret or untrusted value, depending on whether we want to verify confidentiality or integrity IFT properties. To obtain a smaller IFT logic and further speed up the verification, it is possible to make a label for a multi-bit variable; this is the power of the library-based approach.

After extending the variables with security labels, we replace every HDL operation with an IFT-enhanced operation as described earlier. To do so, the node of each assignment statement is examined via in-order traversal. The data flow graph is acquired using Yosys Verilog frontend to transform Verilog code to its Abstract Syntax Tree (AST) representation. For each operation, a module from the available libraries is instantiated (Lines 4-13 in FIG. 13A). This process is shown for a simple code in FIG. 12A-12D. For sequential circuits modeled as always blocks in Verilog language, the same approach is taken by calculating the flow of the right-hand side expression outside the always block and updating the label of the left-hand side variable using the original always block structure.

Figures 12A, 12B, 12C:
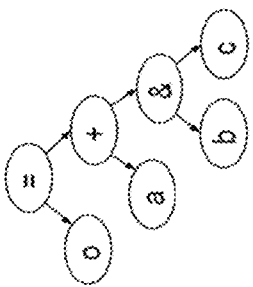
FIG. 12A depicts an example of explicit flow tracking including sample Verilog code.
FIG. 12B depicts an example of a data Flow Graph of code for explicit flow tracking.
FIG. 12C depicts an example of explicit flow tracking of IFT-enhanced Verilog code.

FIGS. 12A-12D depict an example of how RTLIFT translates a snippet of Verilog code. FIG. 12A and FIG. 12B show the Verilog code along with its AST representation, respectively. FIG. 12C shows the instrumented Verilog program which is automatically generated by RTLIFT. Compared to FIG. 12A, RTLIFT adds inputs, wires and output (e.g., a_t, temp_t and o_t) to carry security labels. Furthermore, all original operations (here, "and" and "add") are replaced by corresponding flow tracking operations (here, "and_IFT" and "add_IFT") who analyze both original wires and the security labels. FIG. 12D shows how RTLIFT changes the design schematic. The schematic of the original design (i.e., code in FIG. 12A) and the enhanced version (i.e., code in FIG. 12C) are shown on left and right, respectively.

Tracking Implicit Flows

Merely tracking the explicit flow might inaccurately report the absence of flow in conditional statements by ignoring existence of implicit flows. To track these flows, for each assignment we obtain a list of variables which affect the execution of the statement. Having this list, we generate the logic that may be required for tracking the implicit flow as shown by FIG. 14. This logic can be generated with different levels of precision specified by "flag_im" If we wish to employ a conservative IFT approach, any use of tainted condition should yield a tainted output (Lines 5-7 in FIG. 14). While this approach captures all possible flows of information, it overestimates the actual flow. For a more precise flow tracking, we need to traverse the control flow graph in order to figure out what other outcomes are possible for the right-hand side of the assignment, assuming the conditions were flipped. Now we can model each conditional statement with a multiplexer and acquire the taint of the output using the high-level flow tracking rule for multiplexer (Lines 7-10 in FIG. 14). To better understand the idea, we analyze implicit flow tracking through a simple code shown in FIG. 13A. The highlighted parts in Figure FIG. 13B and FIG. 13C show the logic added to track the implicit flow while e1_t and e2_t represent the explicit flows from the right hand side expressions e1 and e2. As it can be seen in FIG. 13B, the imprecise approach marks the output of a conditional statement as tainted if the condition is tainted by employing an OR logic. Taking a precise approach, information flows from the condition to the output only if the tainted condition occurs when both inputs are tainted or they have different Boolean values.

RTLIFT may be used to analyze security properties on several benchmarks, and here we compare RTLIFT and GLIFT in terms of required time for verifying security policies and the precision of the generated IFT logic.

FIGS. 13A-13C depict an example of conservative and precise tracking logic for tracking implicit flow in Verilog code shown on the top. An explicit flow is and an implicit flow are shown. The conservative model, conservatively assumes all control variables (here "c") affect all left-handsome variables (here, o_t). The precise model maps the control flow to a multiplexer and instruments the design with the precise tracking logic as described earlier in FIG. 9.

Security Proofs

1) Cryptographic Cores: FIG. 15 shows the required time for proving IFT properties on cryptographic cores. As depicted in FIG. 10, RTLIFT was used to generate the IFT logic for the design under test, which is then given to Quetsa Formal Verification tool. To inspect if information flows from input X to output Y, we need to set Xs label high while all other inputs' labels are low and observe Fs label which tells of if information can flow from X to Y or if they are isolated from each other. Two properties have been proven on 32 bit and 128 bit RSA cores: 1) flow from the secret key to the cipher text and 2) flow from secret key to "ready" signal. While the former is expected as it is secured through encryption, the latter reveals an unintended flow. Since the Boolean value of the "ready" signal is not affected by the key value, the detected flow reveals a timing channel. The timeout may be set for one hour for this experiment.

FIG. 15 compares RTLIFT to GLIFT in terms of verification time for verifying confidentiality properties on Verilog implementation of RSA and AES benchmarks from Trusthub. All the properties are tested by marking the key as tainted and observing the labels for the outputs (cipher and the ready signal). As it can be seen, RTLIFT outperforms GLIFT since it is analyzing the design at a higher level of abstraction. The results are collected by using Questa formal tool from Mentor Graphics.

A tool has been used to check confidentiality properties on a number of trust-HUB AES benchmarks that contain hardware Trojans which leaks the secret key to an output other that the cipher text. IFT techniques can be used to detect hardware Trojans that cause unintended flows of information. In a cryptographic core information from the secret key should only flow to the cipher text, and its flow to any other output is undesirable. Hence, we have used the tool to specify if there is a flow from the secret key to any output besides the cipher text. The method is capable of detecting such hardware Trojans while considerably reducing the verification time compared to GLIFT (taken from reference), as reported in Table I.

2) WISHBONE: IFT can be used to detect timing flows in SoC benchmarks. Here, RTLIFT has been used to inspect timing flows between cores that are connected together via the WISHBONE bus architecture. WISHBONE is a protocol developed by the Opencores community and allows multiple devices to interact with each other by sharing a bus. The transaction starts by a master core requesting access from a device by asserting its "cyc" signal. If the slave device is idle, access is granted to the master by setting its "ack" signal. We want to indicate if a certain master's "ack" signal is affected by the requests coming from other masters. To test this, one of the master cores, m1, can be assumed to be untrusted by setting its "cyc_t" signal high. Next, we observe "ack_t" signal from one of the trusted masters, m2. "ack_t" being high indicates a timing flow since we have not marked data values as tainted and m1 requests are affecting the time that m2 can start and finish its computation. This timing flow is a threat to system integrity since it can violate the real-time constraint of the master cores.

Both the conservative and precise IFT logic were generated for comparison. As discussed throughout the paper, the conservative IFT overestimates the existence of information flow resulting in false positives. Our approach is to start the verification process by the conservative IFT which is smaller in terms of area. If isolation can be proved using the conservative IFT, there is no need to verify the properties on the precise version. However, if flow is detected using the conservative approach, we need to repeat the experiments using the precise IFT to avoid getting false positives.

For the original WISHBONE architecture with round robin arbiter, both conservative and precise IFT indicate existence of flow. Next, the WISHBONE arbiter was modified to enforce timing isolation. In our first model, we have implemented a TDMA arbiter. Here, the conservative IFT can prove timing isolation, eliminating the need to test the precise IFT. In our second model, we have divided the masters to two groups with time multiplexed access between the groups and round robin within each group. In this scenario, the conservative IFT reports existence of flow between the two groups, while using the precise IFT we can prove isolation. This final example shows the importance of precision of IFT logic for reducing false positives.

Precision Analysis

The precision and complexity of the IFT logic generated by RTLIFT and GLIFT for data path operations addition and multiplication, have been compared to control path logic modeled as case statements in Verilog language. The precision is measured by comparing the number of tainted outputs during simulation for $2^{20}$ random input samples. As shown by FIG. 16, high level tracking rules result in less tainted flow. False positive percentage is reported as the ratio of the difference in the number of tainted flows to the total number of simulations. The complexity is reported as IFT logic area, which gives a first order estimate on testing and verification time.

IFT-enhanced addition and multiplication operations are designed for the flow tracking library which is given to RTLIFT as an input file. First we have designed a full adder which receives three inputs A, B and Cin along with their labels A_t, B_t and Cin_t and generates outputs Sum and Co along with their labels Sum_t and Co_t. To find Boolean expression describing Sum_t and Co_t, we need to consider Boolean expressions of Sum and Co and find the circumstances under which the output can be flipped. Based on the Boolean equation Sum=A$\oplus$B$\oplus$Cin, the output Sum is tainted when any of the inputs are tainted since each input to an XOR operation can control the output. The Co output is high when more than two inputs are high. Hence the value of Co can be changed if we have control over more than one of the inputs, or we have control over only one input but the other two inputs are not equal. Next, we have employed the IF-enhanced full adder to design a ripple carry adder, and then an IFT-enhance multiplier is built from the adder. As it can be seen from FIG. 16, generating IFT logic at a higher level of abstraction can reduce false positives rate for both data path and control path unit.

In the foregoing, RTLIFT for precisely measuring digital flows through RTL designs in order to formally prove security properties related to integrity, confidentiality and logic side channels was disclosed. RTLIFT can be applied on HDL codes and integrated into the hardware design flow through automated IFT logic augmentation. Furthermore, a tradeoff between the complexity and precision of the IFT logic for data path elements and control path logic separately allowing for fast property-specific verification may be performed. Experimental results show that generating the IFT logic at a higher level of abstraction can increase the IFT precision and improve the performance of security verification.

Figure 17:
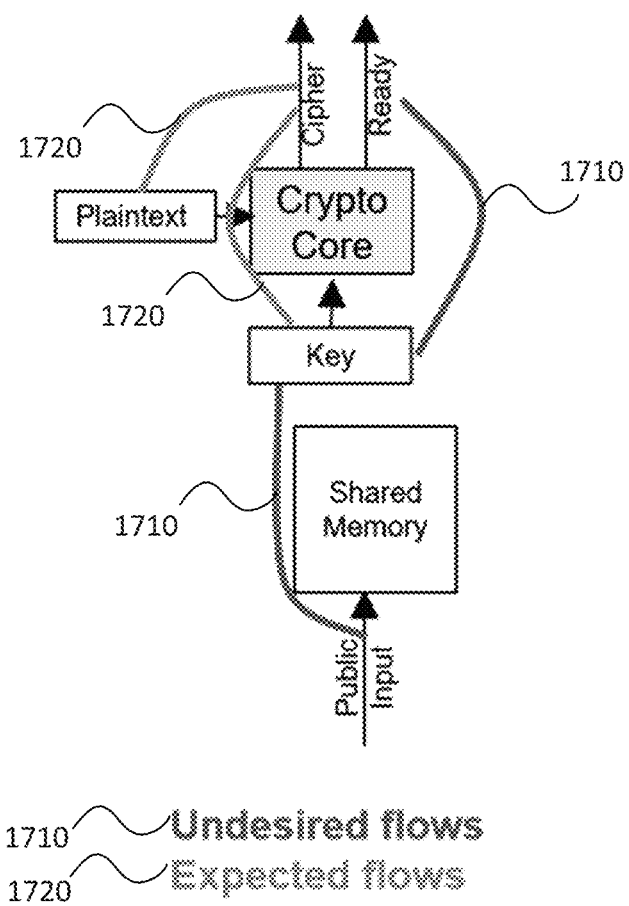
FIG. 17 depicts an example of information flow to be verified in a hardware design.

FIG. 17 depicts an example of information flow to be verified in a hardware design. The lines/arrows 1710 show information flows which are not allowed, while the lines/arrows 1720 show authorized flows of information. Here, the system includes a shared memory unit, a key register, and a cryptographic core. The system receives public inputs and generates the cipher and a ready signal which indicates when the cipher is ready. Properties regarding confidentiality and integrity are to be verified. To show confidentiality, it is shown that there is no flow of information from the key to the ready signal. This is done by marking the key as tainted and observing the label of the ready signal. The property can be written as "key=/=>ready". For integrity, we need to show that the public input does not change the key. This is checked by assigning high label to the public input which is untrusted and observing label of the key register. The property can be written as "public input=/=>key".

Figure 18:
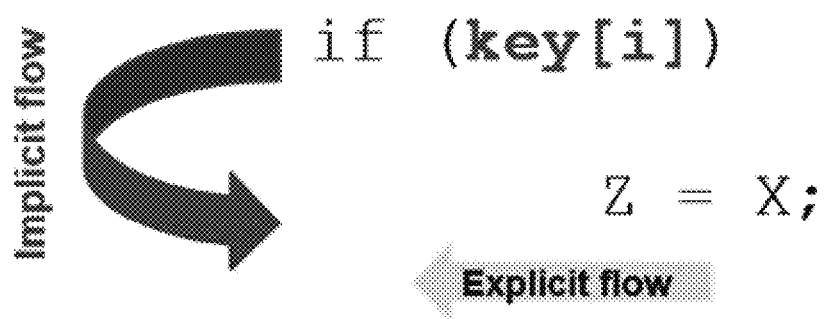
FIG. 18 depicts examples of explicit flows and implicit flows in a hardware description language such as the Verilog language.

FIG. 18 depicts examples of explicit flows and implicit flows in a hardware description language such as the Verilog language. Explicit flows are transfer of information through the data path (e.g., here 'X' flow to 'Z' via the blocking assignment.) while Implicit flows happen through the control flow (e.g., here 'key [i]' flows to 'Z' through the if statement). By tracking both implicit and explicit flows RTLIFT/Clepsydra can track all logical flows and eliminate false negatives.

Figure 19:
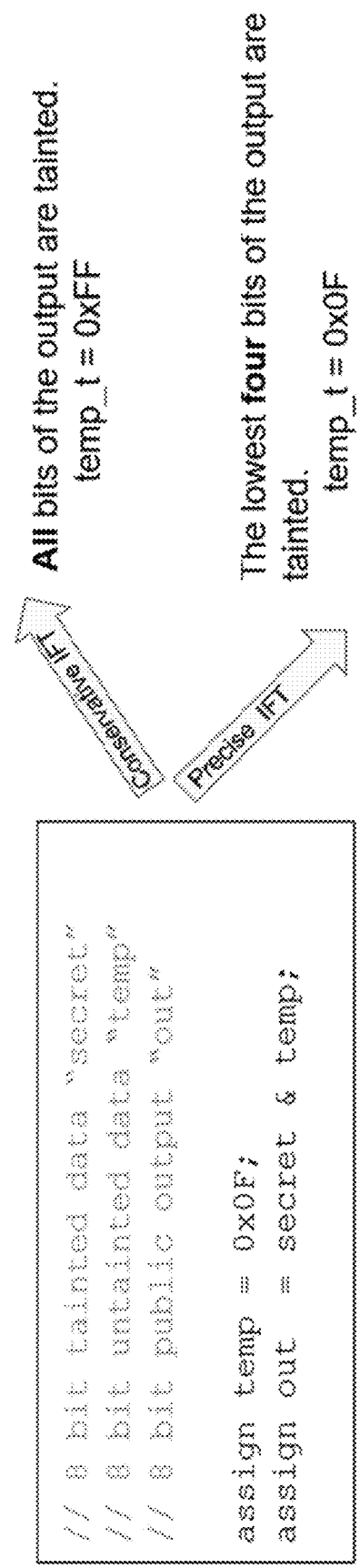
FIG. 19 depicts an example of IFT precision in terms of false positives.

FIG. 19 depicts an example of IFT precision in terms of false positives. Here, we are interested to track the information leakage from the secret input "secret" to output "out". Using a conservative IFT model all bits of variable "out" may be marked as tainted. Using a precise model, the IFT model can realize that the lowest four bits of variable "out" are marked as tainted, and the four significant bits do not carry sensitive information from input "secret". Precise IFT analysis takes into account the operations' functionality (& here) and actual Boolean values of the variables (temp=0x0F here). By utilizing a precise of IFT model RTLIFT/Clepsydra reduces the number of false positives.

Figure 20:
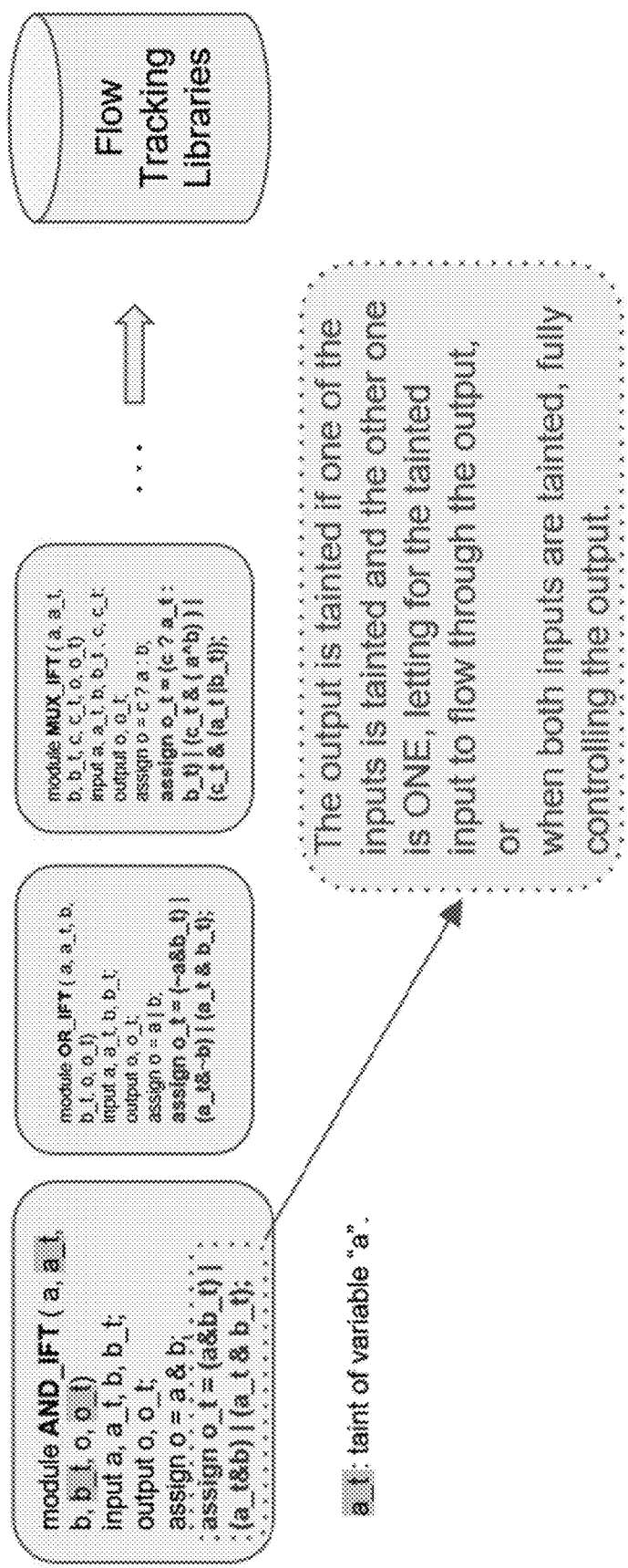
FIG. 20 depicts an example of precise flow tracking rules for several example Verilog operations.

FIG. 20 depicts an example of precise flow tracking rules for several example Verilog operations (AND, OR, mulitplexer). For example, module "AND IFT" which is tracking information flow for an AND operation receives original inputs to the AND gate (here, "a" and "b") along with their labels ("a_t" and "b_t") and generates the Boolean output "o" and it's label "o_t" The tracking rule indicates that the output is tainted either when one of its inputs is tainted while the other one has Boolean value of one or when both inputs are tainted. These flow tracking rules are predefined and stored as flow tracking libraries and are used by RTLIF/Clepsydra.

Figure 21:
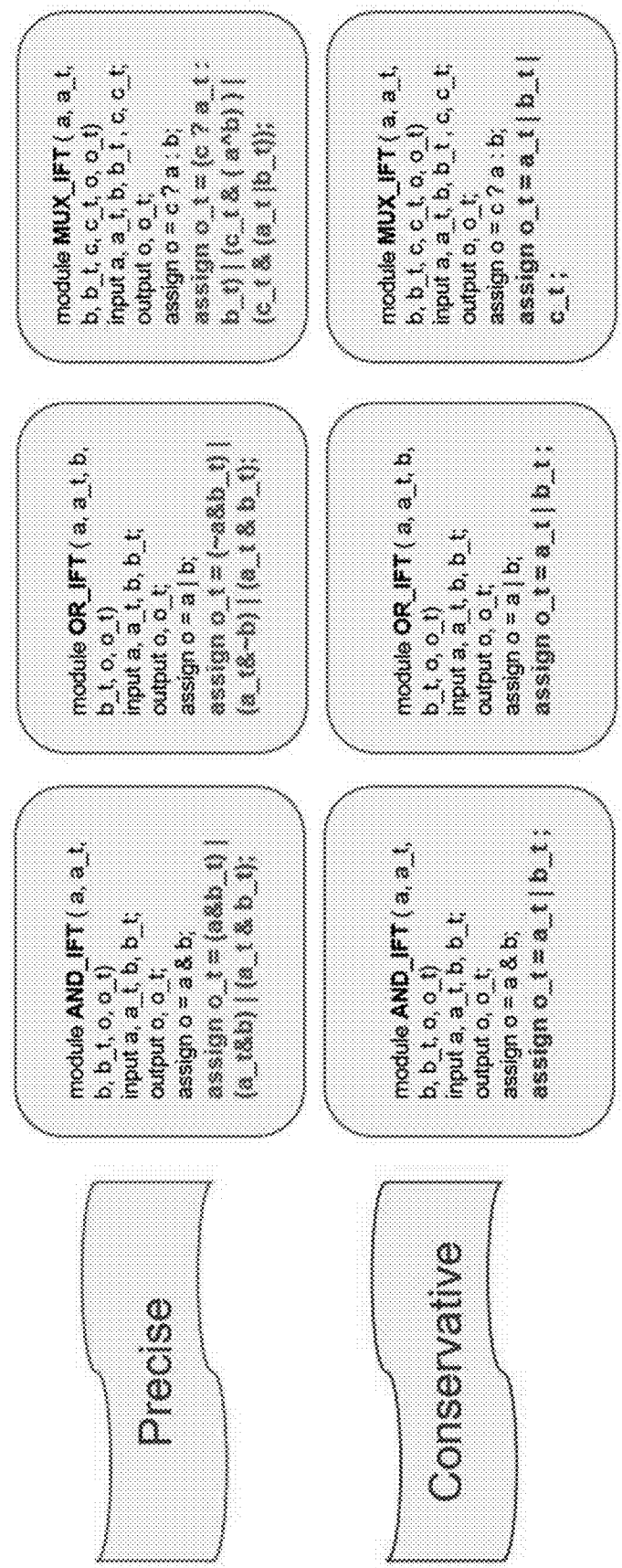
FIG. 21 depicts examples of precise and conservative flow tracking rules for several Verilog operations.

FIG. 21 depicts examples of precise and conservative flow tracking rules for several Verilog operations (AND, OR, mulitplexer). The conservative model simply checks the connectivity between inputs and outputs and marks the output as tainted if any of the inputs are tainted. The precise model further considers operations' functionality and actual Boolean values. While the precise model reduces the number of false positives, it imposes more overhead in terms of verification time. RTLIFT enables the user to choose between these libraries.

Figure 22:
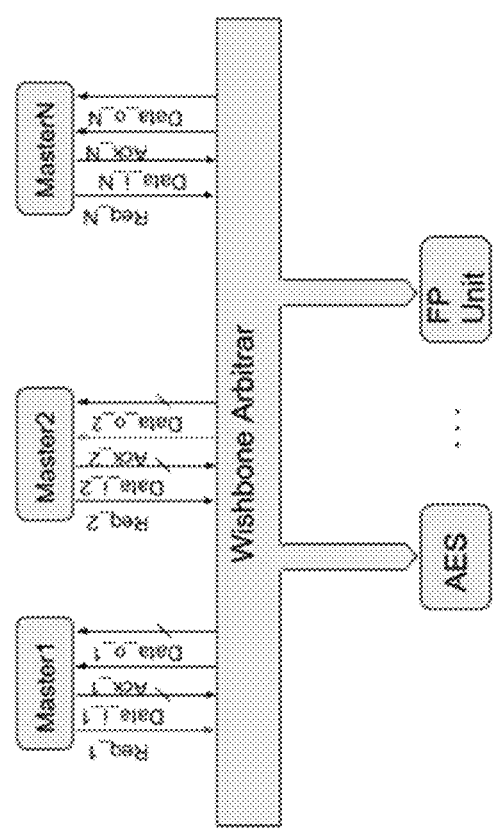
FIG. 22 shows an example of a wishbone arbiter mediating access between N master cores requesting access to shared units (AES and FP unit).

FIG. 22 shows an example of a wishbone arbiter mediating access between N master cores requesting access to shared units (AES and FP unit). Information flow from master core "i" to master core "j" can be tested by marking the request signal "req_i" from one master core as tainted and observing the label of the acknowledge signal "ack_j" received by core "j".

Figure 23:
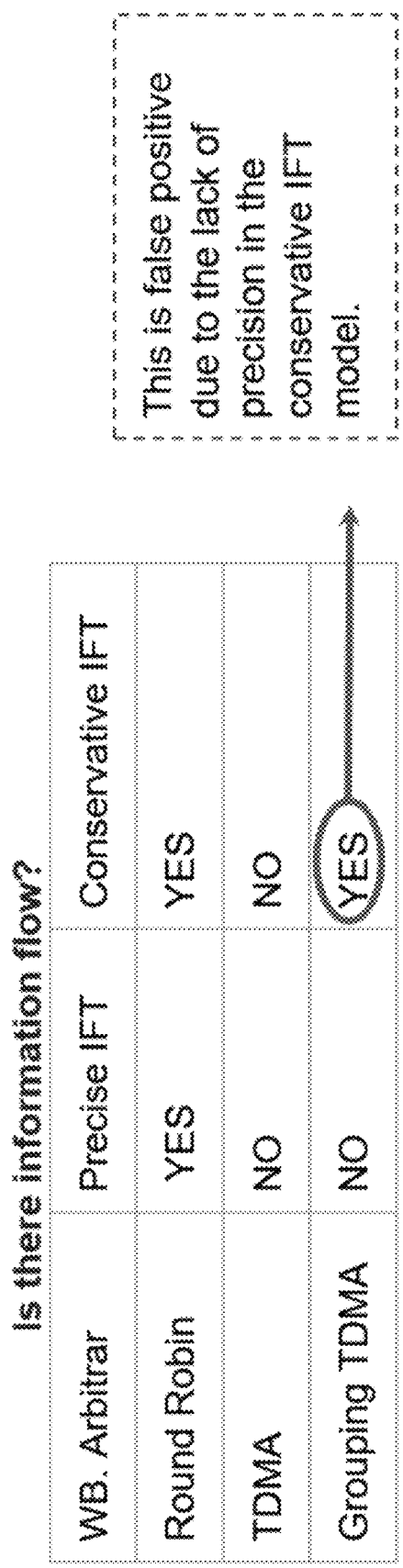
FIG. 23 shows an example the result of using RTLIFT to verify the information flow properties between master cores in FIG. 22.

FIG. 23 shows an example the result of using RTLIFT to verify the information flow properties between master cores in FIG. 22. If a round robin scheduling scheme is used both precise and conservative model detect existence of information flow. In case of TDMA policy, both precise and conservative models can be used to prove absence of information flow. If the cores are divided into two groups where TDAM is used between the two groups and round robin is used in each group, the conservative model states that flow of information exists between the two groups. However, the using the precise model we can prove absence of information flow. This is an example where the conservative model generates false positives.

Figure 24:
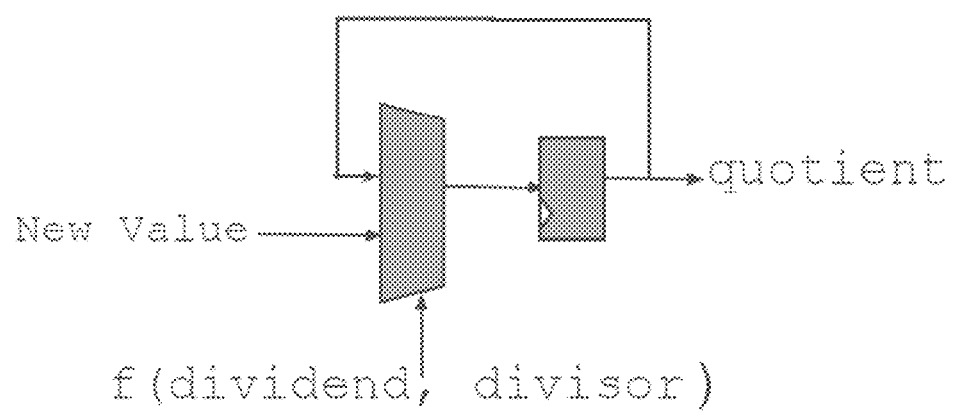
FIG. 24 depicts an example of a schematic of an always block.

FIG. 24 depicts an example of a simplified schematic of the always block shown in the following. Here the register holding the "quotient" is updated conditionally as shown by "while(dividend >divisor)" in the code. This conditional update manifests itself as a feedback loop in the schematic and shows existence of timing variation from "dividend/divisor" to "quotient"

Figure 25:
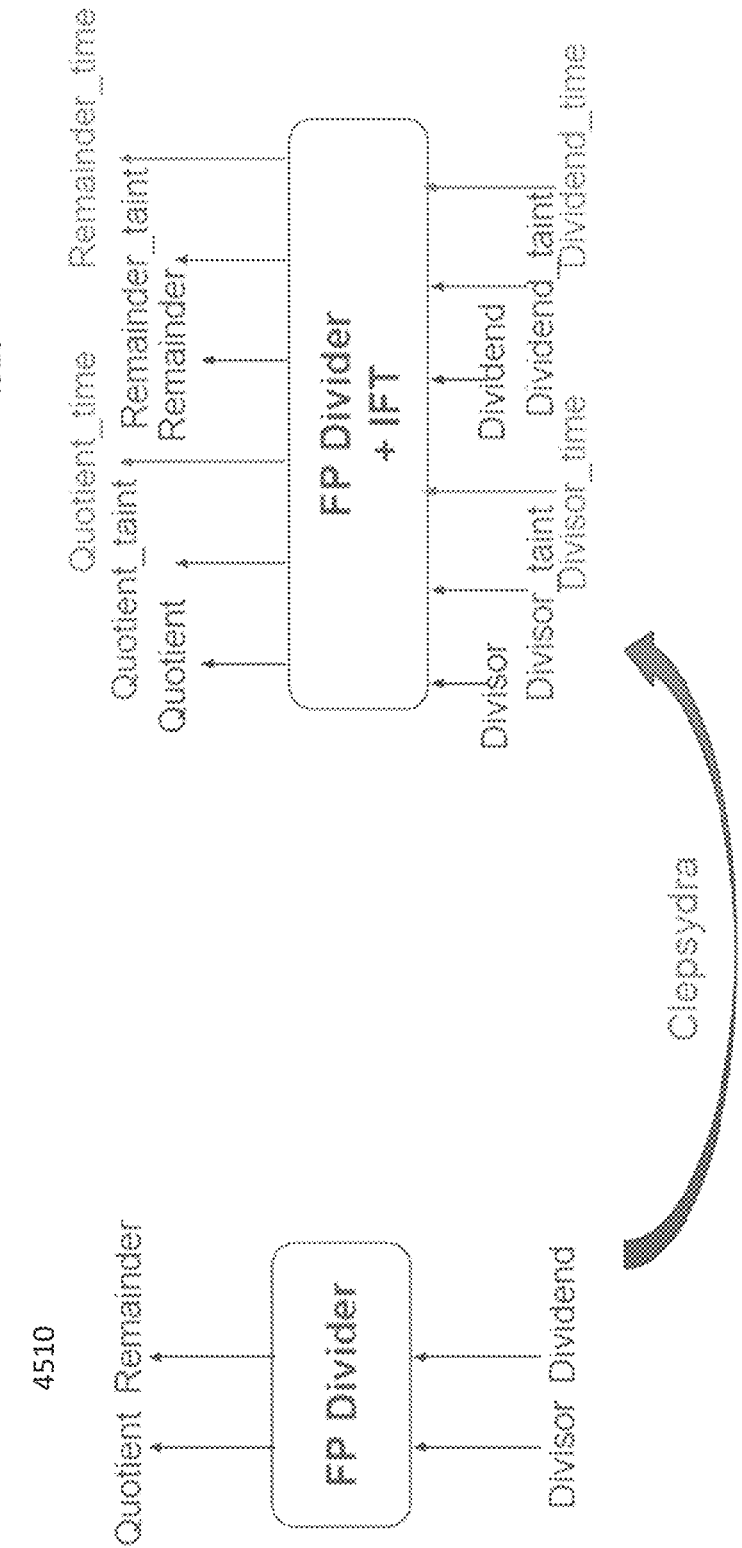
FIG. 25 shows floating point divider instrumented by Clepsydra.

FIG. 25 shows floating point divider instrumented by Clepsydra. The design 4510 can be instrumented by Clepsydra as shown at 4520. After instrumentation each input/output is extended with security labels "taint" and "time". The information flow properties verified for this design are elaborated in 267.

Figure 26:
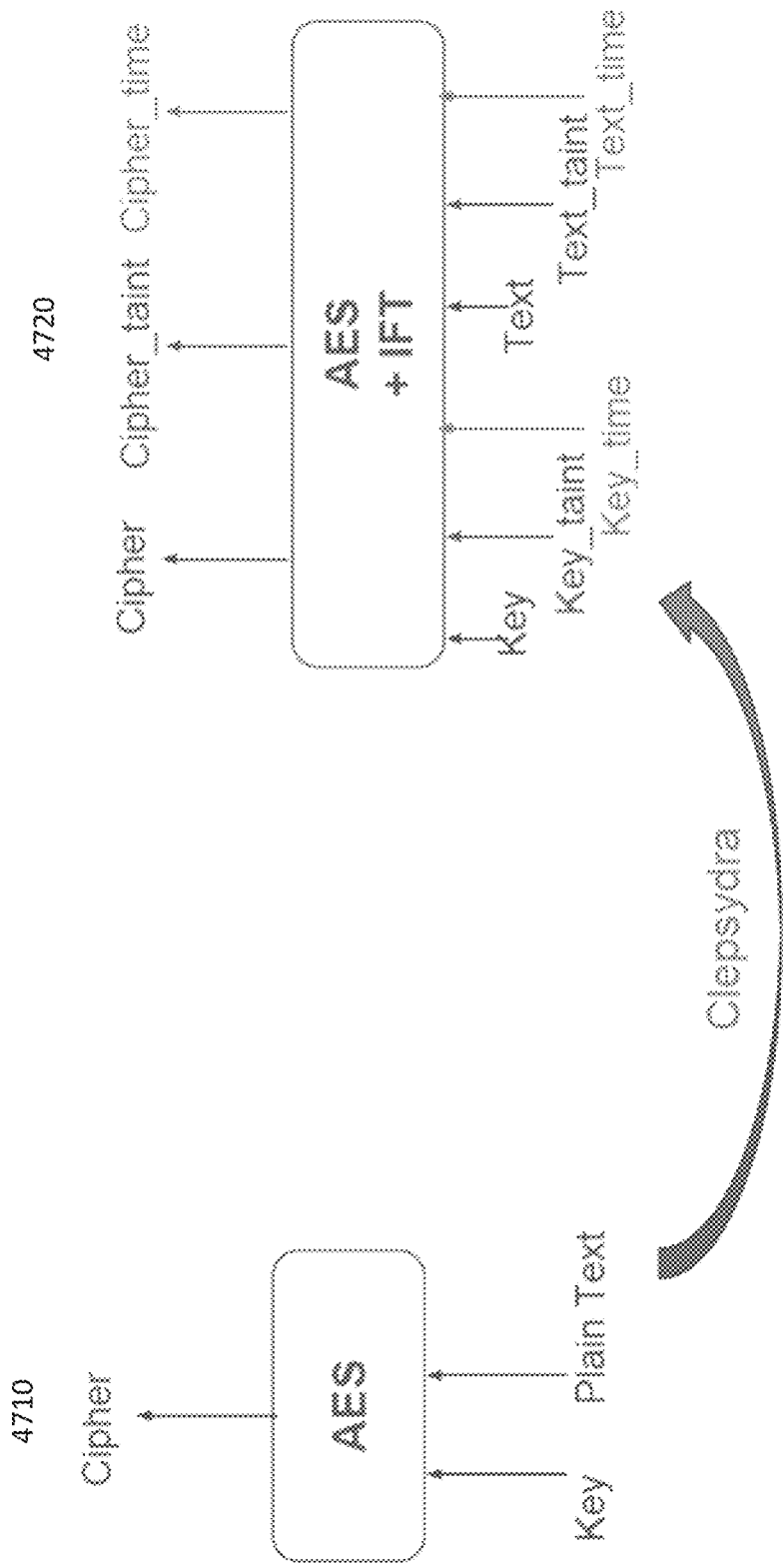
FIG. 26 shows an abstract model of an AES core which receives key and plain text and generates cipher.

FIG. 26 shows an abstract model of an AES core which receives key and plain text and generates cipher. The design 4710 can be instrumented by Clepsydra as shown at 4720. After instrumentation each input/output is extended with security labels "taint" and "time". The information flow properties verified for this design are elaborated in 269.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

It is intended that the specification, together with the drawings, be considered exemplary only, where exemplary means an example. As used herein, the singular forms "a", "an" and "the" are intended to include the plural forms as well, unless the context clearly indicates otherwise. Additionally, the use of "or" is intended to include "and/or", unless the context clearly indicates otherwise.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A computer-implemented method, comprising:
   receiving a hardware design language (HDL) representation of a circuit;
   inserting an HDL representation of circuitry for flow tracking into the HDL representation of the circuit, wherein the flow tracking adds one or more security labels to signals propagating through the circuit to enable tracking of the signals during the propagating; and
   generating an enhanced HDL representation of the circuit, wherein the enhanced HDL representation comprises the HDL representation of the circuit and the HDL representation of the circuitry for flow tracking,
   wherein the enhanced HDL representation including the one or more security labels enables a security determination of the HDL representation of the circuit based on the flow tracking,
   wherein the one or more security labels include at least one security label for tracking a timing flow using a set of timing flow propagation rules, and
   wherein the set of timing flow propagation rules tracks only timing flows while ignoring functional ones.

2. The computer-implemented method of claim 1, wherein the HDL representation comprises at least one logical operation performed by the circuit.

3. The computer-implemented method of claim 1, wherein the HDL representation comprises at least one conditional assignment performed by the circuit.

4. The computer-implemented method of claim 1, wherein the HDL representation is an abstract syntax tree (AST).

5. The computer-implemented method of claim 1, wherein the security determination includes a determination of an isolation of the HDL circuit from other circuits based on the one or more security labels.

6. The computer-implemented method of claim 1, wherein the security determination includes a determination of a confidentiality, wherein the confidentiality indicates untrusted listeners cannot observe information related to the circuit.

7. The computer-implemented method of claim 1, wherein the security determination includes a determination of an integrity, wherein the integrity indicates no unauthorized access to sensitive information is possible.

8. The computer-implemented method of claim 4, wherein the AST comprises a plurality of registers, the method further comprising:
   enumerating a number of paths to each register of the plurality of registers; and
   enumerating a number of controllers of the each register of the plurality of registers.

9. The computer-implemented method of claim 8, further comprising:
   inserting a buffer at an output of at least one of the plurality of registers.

10. The computer-implemented method of claim 4, further comprising:
    extracting a control flow graph representation of the circuit from the AST; and
    traversing the control flow graph to identify each of a plurality of conditional assignments.

11. The computer-implemented method of claim 4, further comprising:
    extracting a data flow graph representation of the circuit from the AST; and
    enumerating the each of a plurality of operations based on the data flow graph.

12. The computer-implemented method of claim 1, wherein the flow tracking is available as an HDL design module in a computer aided design tool.

13. An apparatus for improving security of a hardware design, comprising:
    at least one processor; and
    at least one memory, the memory including instructions that when executed by the at least one processor cause operations comprising:
    receiving a hardware design language (HDL) representation of a circuit;
    inserting an HDL representation of circuitry for flow tracking into the HDL representation of the circuit, wherein the flow tracking adds one or more security labels that are tracked throughout the circuit; and
    generating an enhanced HDL representation of the circuit, wherein the enhanced HDL representation comprises the HDL representation of the circuit and the HDL representation of the circuitry for flow tracking, wherein the enhanced HDL representation including the one or more security labels that are tracked throughout the circuit enables a security determination of the HDL representation of the circuit based on the flow tracking, wherein the one or more security labels include at least one security label for tracking a timing flow using a set of timing flow propagation rules, and wherein the set of timing flow propagation rules tracks only timing flows while ignoring functional ones.

14. The apparatus of claim 13, wherein the HDL representation comprises at least one an operation.

15. The apparatus of claim 13, wherein the HDL representation comprises at least one conditional assignment.

16. The apparatus of claim 13, wherein the HDL representation is an abstract syntax tree (AST).

17. The apparatus of claim 13, wherein the security determination includes a determination of an isolation of the HDL circuit from other circuits.

18. The apparatus of claim 13, wherein the security determination includes a determination of a confidentiality, wherein the confidentiality indicates untrusted listeners cannot observe information related to the circuit.

19. The apparatus of claim 13, wherein the security determination includes a determination of an integrity, wherein the integrity indicates unauthorized modification of sensitive information cannot be performed.

* * * * *